(12) United States Patent
Monteith et al.

(10) Patent No.: US 10,938,389 B2
(45) Date of Patent: Mar. 2, 2021

(54) GESTURE CONTROL FOR IN-WALL DEVICE

(71) Applicant: Hubbell Incorporated, Shelton, CT (US)

(72) Inventors: Shawn Monteith, Burlington, CT (US); Michael Tetreault, Simsbury, CT (US); Daniel Gould, East Hampton, CT (US); Nicholas Kraus, Enfield, CT (US)

(73) Assignee: Hubbell Incorporated, Shelton, CT (US)

( * ) Notice: Subject to any disclaimer, the term of this patent is extended or adjusted under 35 U.S.C. 154(b) by 0 days.

(21) Appl. No.: 16/225,334

(22) Filed: Dec. 19, 2018

(65) Prior Publication Data

US 2019/0190519 A1    Jun. 20, 2019

Related U.S. Application Data

(60) Provisional application No. 62/673,239, filed on May 18, 2018, provisional application No. 62/640,296, filed on Mar. 8, 2018, provisional application No. 62/608,121, filed on Dec. 20, 2017.

(51) Int. Cl.
*H03K 17/94* (2006.01)
*G06F 3/01* (2006.01)
*G01J 5/02* (2006.01)
*G10L 15/26* (2006.01)

(52) U.S. Cl.
CPC ............ *H03K 17/941* (2013.01); *G01J 5/025* (2013.01); *G06F 3/017* (2013.01); *G10L 15/26* (2013.01); *H03K 2217/94106* (2013.01)

(58) Field of Classification Search
CPC ....... H03K 17/941; H03K 2217/94106; H03K 17/94; G01J 5/025; G01J 5/02; G06F 3/017; G06F 3/01; G10L 15/265; G10L 15/26
See application file for complete search history.

(56) References Cited

U.S. PATENT DOCUMENTS

| | | |
|---|---|---|
| 5,984,494 A | 11/1999 | Chapman et al. |
| 8,477,955 B2 | 7/2013 | Engle |
| 9,304,736 B1 | 4/2016 | Whiteley et al. |
| 9,530,413 B2 | 12/2016 | Deng et al. |
| 2001/0000534 A1 | 4/2001 | Matulich et al. |
| 2001/0045803 A1 | 11/2001 | Cencur |
| 2003/0013503 A1 | 1/2003 | Menard et al. |

(Continued)

FOREIGN PATENT DOCUMENTS

WO    WO 2009/135722    11/2009

OTHER PUBLICATIONS

PCT International Search Report and Written Opinion for corresponding PCT Application No. PCT/US2018/066436, dated Feb. 28, 2019, 12 pages.

*Primary Examiner* — Robert L Deberadinis
(74) *Attorney, Agent, or Firm* — Michael Best & Friedrich, LLP

(57) ABSTRACT

A method for controlling operation of a power switch includes obtaining, by one or more processors of a power switch, data indicative of one or more non-contact gestures. The method includes determining, by the one or more processors, a control action based at least in part on the data indicative of the one or more non-contact gestures. The method includes implementing, by the one or more processors, the control action.

16 Claims, 21 Drawing Sheets

(56) References Cited

U.S. PATENT DOCUMENTS

| | | |
|---|---|---|
| 2004/0193413 A1* | 9/2004 | Wilson ................... G06T 7/20 |
| | | 704/243 |
| 2007/0289860 A1 | 12/2007 | Newman |
| 2008/0001649 A1 | 1/2008 | Cencur |
| 2012/0076328 A1 | 3/2012 | Harwood |
| 2013/0277690 A1 | 10/2013 | Ibbetson |
| 2013/0300316 A1 | 11/2013 | Engel-Hall et al. |
| 2014/0111381 A1 | 4/2014 | Lin |
| 2014/0166453 A1 | 6/2014 | Prest et al. |
| 2014/0172953 A1 | 6/2014 | Blanksteen |
| 2014/0225526 A1 | 8/2014 | Jonsson |
| 2014/0249817 A1 | 9/2014 | Hart et al. |
| 2014/0278438 A1 | 9/2014 | Hart et al. |
| 2014/0304418 A1 | 10/2014 | Torok et al. |
| 2014/0343946 A1 | 11/2014 | Torok et al. |
| 2015/0139483 A1* | 5/2015 | Shen .................... H05B 47/105 |
| | | 382/103 |
| 2015/0154976 A1 | 6/2015 | Mutagi |
| 2015/0279387 A1 | 10/2015 | List |
| 2016/0316293 A1 | 10/2016 | Klimanis |
| 2016/0374182 A1* | 12/2016 | Newton ............. G06F 3/04883 |
| 2017/0098517 A1 | 4/2017 | Willis |
| 2017/0117891 A1* | 4/2017 | Lohbihler .............. G08C 17/02 |
| 2017/0200009 A1 | 7/2017 | Bertolet et al. |
| 2017/0234562 A1 | 8/2017 | Ribbich et al. |
| 2018/0108497 A1 | 4/2018 | O'Keeffe |

\* cited by examiner

GESTURE CONTROL FOR IN-WALL DEVICE

PRIORITY CLAIM

The present application is based on and claims priority to U.S. Provisional App. No. 62/608,121, titled "Gesture Control for In-Wall Device," having a filing date of Dec. 20, 2017, which is incorporated by reference herein. The present application is also based on and claims priority to U.S. Provisional App. No. 62/640,296, titled "Gesture Control for In-Wall Device," having a filing date of Mar. 8, 2018. In addition, the present application is based on and claims priority to U.S. Provisional App. No. 62/673,239, titled "Gesture Control for In-Wall Device," having a filing date of May 18, 2018.

FIELD

The present disclosure relates generally to in-wall devices, such as power switch devices.

BACKGROUND

In-wall devices can include devices that can be mounted on or at least partially disposed in a wall or other surface (e.g., in a wall mounted electrical box). Example in-wall devices can include power switches used to control various powered devices, such as electronics, light sources, appliances, power outlets, and other devices. Power switches can control power delivered to a load, for instance, by interrupting a conductor delivering power to a load. Example power switches can include, for instance, single or multiple on/off toggle switches, paddle or rocker switches, single or multiple pole dimmer switches, power outlets, etc.

With the advance of Internet of Things (IoT) technology, power switches and other in-wall devices can communicate with other electronic devices over one or more communication links. For instance, power switches can be capable of communicating using communication technologies, such as Bluetooth low energy, Bluetooth mesh networking, near-field communication, Wi-Fi, ZigBee, Ethernet, etc.

SUMMARY

Aspects and advantages of embodiments of the present disclosure will be set forth in part in the following description, or may be learned from the description, or may be learned through practice of the embodiments.

One example aspect of the present disclosure is directed to a power switch. The power switch includes a housing mountable on or at least partially within a surface. The housing includes a front panel. The power switch includes an interface element disposed on the front panel. The power switch includes a power interrupter. The power interrupter is operable to control power deliver to one or more powered loads based, at least in part, on user interaction with the interface element. The power switch includes one or more processors. The one or more processors can be configured to obtain data indicative of one or more non-contact gestures. The one or more processors can be further configured to determine a control action based, at least in part, on the data indicative of the one or more non-contact gestures. The one or more processors can be further configured to implement the control action.

Another example aspect of the present disclosure is directed to a method for operating a power switch. The method includes obtaining, by one or more processors at the power switch, data indicative of one or more non-contact gestures. The method includes determining, by the one or more processors, a control action based at least in part on the data indicative of the one or more non-contact gestures. The method includes implementing, by the one or more processors, the control action.

Yet another example aspect of the present disclosure is directed to a power switch. The power switch includes a housing mountable on or at least partially within a surface. The housing includes a front panel. The power switch includes an interface element disposed on the front panel. The power switch includes a power interrupter. The power interrupter is operable to control power deliver to one or more powered loads based, at least in part, on user interaction with the interface element. The power switch includes one or more processors. The one or more processors can be configured to obtain data indicative of presence of a user in a space associated with the power switch. The one or more processors can be further configured to determine a control action based, at least in part, on the data indicative of presence of the user. The one or more processors can be further configured to implement the control action.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
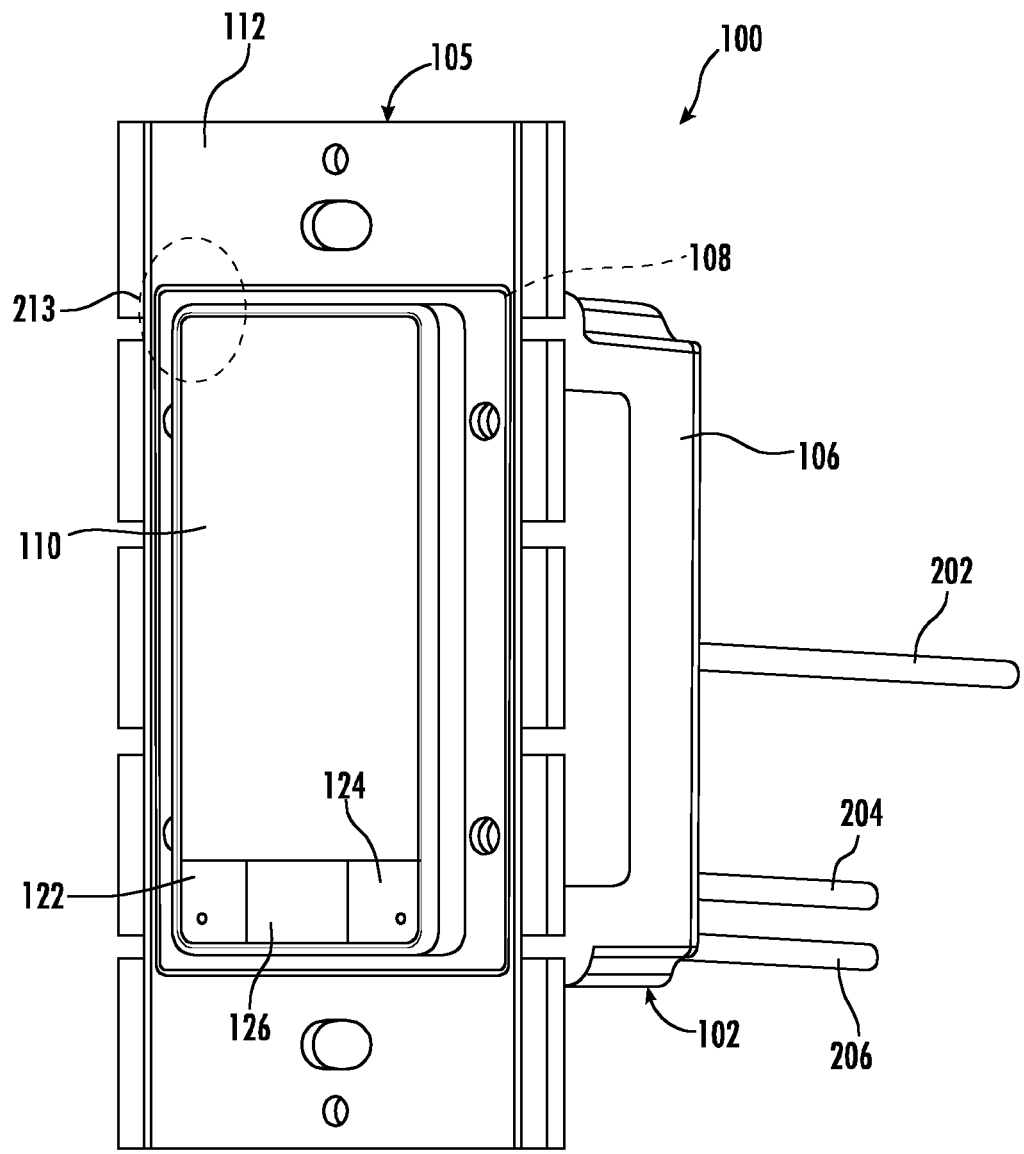
FIG. 1 depicts a perspective view of an example power switch according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to in-wall devices for controlling and/or powering one or more other devices, such as electrical loads. In some embodiments, the in-wall device can be a power switch, such as a single or multiple on/off toggle switch, paddle or rocker button, single or multiple pole dimmer switch, power outlet, or other device capable of controlling power delivery to one or more powered loads. For instance, the power switch can be configured to interrupt electrical power delivery to one or more loads by interrupting or controlling power to a conductor delivering electrical power to the load.

Embodiments of the present disclosure will be discussed with reference to a power switch for purposes of illustration and discussion. Those of ordinary skill in the art, using the disclosures provided herein, will understand that aspects of the present disclosure are applicable in other in-wall devices. As used herein, an "in-wall device" is an electrical or electronic device that can be mounted on and/or in a wall or other surface, such as a panel, ceiling, floor, or other surface. In some embodiments, an in-wall device can be mounted in an electrical box that is secured on and/or in a wall or other surface.

It should be appreciated that the in-wall device can be mounted in any suitable type of electrical box. For example, in some implementations, the in-wall device can be mounted in a single gang electrical box. As another example, the in-wall device can be mounted in a double gang electrical box. As yet another example, the in-wall device can be mounted in a triple gang electrical box.

The power switch can be a "smart" device. For instance, the power switch can include one or more processors and one or memory devices. The one or more processors can execute computer-readable instructions stored in the one or more memory devices to provide desired functionality. Example functionality can include communicating with other devices over one or more communication links. For instance, the power switch can communicate with an electrical load (e.g., a lighting fixture, ceiling fan, appliance, electronic device, electrical outlet, home device, etc.) to control operation of the electrical load. The power switch can communicate with one or more other computing devices (e.g., servers, cloud computing devices, user devices such as smartphones, tablets, wearable devices, etc.) to receive data, access processing resources, store data, receive user input or controls, access models, access services (e.g., digital audio assistant services), receive software updates or other updates, etc.

Example communication technologies and/or protocols can include, for instance, Bluetooth low energy, Bluetooth mesh networking, near-field communication, Thread, TLS (Transport Layer Security), Wi-Fi (e.g., IEEE, 802.11), Wi-Fi Direct (for peer-to-peer communication), Z-Wave, ZigBee, HaLow, cellular communication, LTE, low-power wide area networking, VSAT, Ethernet, MoCA (Multimedia over Coax Alliance), PLC (Power-line communication), DLT (digital line transmission), etc. Other suitable communication technologies and/or protocols can be used without deviating from the scope of the present disclosure.

According to example embodiments of the present disclosure, the power switch can be capable of performing one or more actions based at least in part on audio data (e.g., voice commands) received at the power switch. For instance, the power switch can include at least one microphone configured to obtain an audio input. The audio input can be, for instance, a voice command received from a user. Responsive to the audio input, the power switch can be configured to take one or more actions. For instance, one or more processors located in the power switch can perform audio processing on the audio input to recognize voice commands and control the power switch to take one or more actions. In addition, and/or in the alternative, the audio input can be communicated to one or more other devices (e.g., cloud computing devices) for audio processing to recognize voice commands.

In some embodiments, responsive to the audio input, the power switch can be configured to take actions associated with controlling and/or providing power to one or more devices powered by the in-wall device. As an example, a power switch can be configured to control power delivery or otherwise provide control signals to a powered device, such as one or more lighting fixtures, appliances, electronic devices, user devices, etc., in response to audio commands received as audio input at the power switch.

In some embodiments, the audio input can be used to take actions ancillary to operation of the power switch or loads powered by the power switch. For instance, the audio input can be communicated to one or more devices for implementation of a digital audio assistant service. The digital audio assistant service can process the audio input to identify one or more voice commands and take action responsive to the search commands. As an example, the digital audio assistance can access search results, conduct online shopping, play music, set appointments/reminders, perform tasks, control networked devices, etc.

In some embodiments, the audio input can be processed (e.g., using classifier models, such as machine learned models) to recognize certain sounds. For instance, the audio input can be processed to recognize sounds associated with, for instance, a smoke alarm, an environmental sensor alarm, breaking glass, etc. The power switch can be configured to take appropriate action in response to the sound. For instance, the power switch can provide an audio output alerting a user of a hazard condition. The power switch can communicate data associated with the hazard condition to a monitoring service and/or to a user so that an appropriate response can be implemented. The power switch can control one or more powered loads in response to a hazard condition, such as illuminating a space, turning power off to one or more appliances, etc.

The power switch can include an audio output device (e.g., a speaker) for providing audio output responsive to the audio input. In some embodiments, the audio output device can be a 20 millimeter (mm) speaker. The audio output can be a response to one or more audio commands received as audio input by one or more microphones located on the in-wall device. The audio output device can also be used, for instance, to play music or to play sounds associated with a connected media device (e.g., a television).

In some embodiments, a user can interface with a power switch via a user device connected to the power switch via a communication link. For instance, a user can access an application implemented on a user device (e.g., a smartphone, tablet, laptop, wearable device, display with one or more processors, etc.). The application can present a graphical user interface or other user interface (e.g., audio interface) to a user. A user can interact with the graphical user interface to control settings and/or operation of the power switch. Signals associated with the user interaction can be communicated to the power switch, for instance, over a network to control and/or adjust settings of the power switch. In addition, and/or in the alternative, data collected by the power switch (e.g., one or more sensors, power meters, etc., associated with the power switch) can be communicated to the user device for presentation to the user.

In some example embodiments, the power switch can include a housing mountable on or at least partially within a surface, such as a wall, panel, ceiling, floor, or other surface. The housing can include a front panel. At least a portion of the front panel can be visible to a user when the power switch is installed on the surface.

The power switch can include an interface element disposed on the front panel. The interface element can be operable to receive a user input to control operability of the power switch. For instance, in some embodiments, the interface element can be a rocker button or switch. When the rocker button is depressed in a first direction, the power switch can be controlled to deliver power to a powered load. When the rocker button is depressed in a second direction, the power switch can be controlled to turn off power to the powered load. In this way, a user can interact with the interface element to control power delivery to one or more powered loads. Other suitable interface elements can be used without deviating from the scope of the present disclosure, such as toggle switches, dimmer knobs, sliders, touch screens, touch pads, etc.

In some embodiments, the rocker button can include one or more capacitive touch sensors or other touch sensors. This can allow a user to interact with the rocker button without having to mechanically manipulate the rocker button. For instance, a user can control the power switch to turn on or turn off power to a powered device by performing a finger swipe on a surface of the rocker button. As an example, a vertical swipe can be used to toggle power on and off to one or more powered devices. A horizontal swipe can be used to change an operating mode of the power switch (e.g., from a passive listening mode to an active listening mode). A circular swipe (e.g., clockwise and/or counterclockwise) can be used, for instance, to control dimming of one or more light sources powered by the power switch.

The power switch can include a power interrupter operable to control power delivery to the powered load based at least in part on user interaction with the interface element. The power interrupter can be any suitable device configured to interrupt and/or un-interrupt power to a powered load. For instance, in some embodiments, the power interrupter can be a thyristor (e.g., TRIAC device), semiconductor switching element (e.g., transistor), relay, contactor, etc., that is controlled to provide power or to not provide power to a powered load. The power interrupter can be controlled based at least in part on user interaction with the interface element. The power interrupter can also be controlled based on signals received at the power switch over, for instance, a communications interface (e.g., in response to signals received over a network from a user device such as a smartphone, tablet, wearable device, laptop, or other device).

The power switch can include one or more microphones configured to obtain an audio input. For instance, the power switch can include a first microphone and a second microphone. The power switch can include an audio output device, such as a speaker. The first microphone, second microphone, and speaker can be arranged in the power switch to provide enhanced audio performance of the power switch.

For instance, in some embodiments, the front panel of the power switch can include a front panel having a rocker button. The speaker can be located behind the rocker button. Locating the speaker behind the rocker button can allow for sound emanating from the speaker to be amplified, reducing the need for a large speaker. In this way, a smaller speaker can be used while maintaining a loud, full sound typically available from larger speakers. A sound gap can be incorporated around the sides of the rocker button to allow sound to escape from the power switch while hiding the appearance of the speaker from the front of the power switch.

The front panel can further include a first button and a second button located beneath the rocker button in a vertical direction. In some embodiments, a Fresnel lens can be disposed between the first button and the second button. The first button can be used, for instance, to pair the power switch with one or more powered loads over a communication link (e.g., Bluetooth low energy, etc.). The second button can be used as an airgap switch. One or more sensors (e.g., a passive infrared sensor, ambient light sensor, etc.) can be located behind the Fresnel lens.

The first microphone can be disposed in the first switch. The second microphone can be disposed in the second switch. In this way, the positioning of the first microphone and the second microphone can be used, for instance, for beam sweeping to determine the originating location of sounds in a space. Moreover, the location of the first microphone and the second microphone can be positioned away from the speaker so that there is less sound from the speaker projected into the microphones. More particularly, the first microphone and the second microphone can be located in the bottom left-hand and right-hand corners of the power switch, respectively, creating a large separation from the speaker located near the top of the power switch. This can provide for efficient operation of audio echo cancellation using the microphones. In some embodiments, a sound deflector can be positioned relative to the speaker to deflect sound away from the microphones to increase performance (e.g., to increase the capability for audio cancellation).

In some embodiments, the power switch can include one or more indicators, such as a light ring and/or a light bar. For instance, the power switch can include a ring of light emitting diodes (LEDs) or other light sources positioned behind a rocker button. The rocker button can be made from a plastic material that acts as a light pipe and a light diffuser for light emitted from the ring of LEDs so that a light ring is depicted on the rocker button.

In some embodiments, the light ring can be controlled in response to various actions, such as responsive to voice commands. For instance, in some embodiments, the light ring can be controlled to be displayed in response to a voice command received via the one or more microphones. Once the voice command is completed, the light ring can be turned off or no longer illuminated. In some embodiments, various different animation sequences can be displayed in response detection of different voice commands or other user input. For instance, a circular animation configured to mimic a spinning circle can be displayed in response to detection of a voice command.

In some embodiments, a night light (e.g., a light bar) can be disposed on the front of the rocker button. The night light can provide ambient lighting at night, allowing a user to easily locate the power switch in the dark. The color and/or brightness of the night light can be specified as part of settings associated with the power switch (e.g., via an application implemented on a user device). In some embodiments, the night light can be disposed in the center of the light ring.

The power switch can have various other features to enhance the functionality of the device. For instance, in some embodiments, the power switch can have power metering incorporated into the power switch. Power metering can be implemented, for instance, by measuring voltage and/or current flowing through a load wire passing through the power switch. Current can be measured, for instance, using a sense resistor. Voltage can be measured using, for instance, a voltage divider. Power flowing through the load wire can be computed (e.g., using one or more processors located on the power switch and/or remote from the power switch) based on the measured current and voltage.

The information from power metering can be used for a variety of purposes. For example, in some embodiments, data indicative of power consumption can be communicated to a user device (e.g., over a network) to provide feedback (e.g., real-time feedback) of power consumption by one or more powered loads powered by the power switch to the user. As another example, in some embodiments, the power switch and/or a device in communication with the power switch can process data indicative of power consumption to detect when power delivered to a powered load exceeds a power rating associated with the powered load. The power switch can be configured to automatically reduce power delivered to the powered load to a safe level. In addition, an alert can be communicated to a user.

As used herein, an "alert" provided by the power switch can be an audio alert, visual alert, electronic data communication, display on a user interface associated with a device in communication with the power switch, etc. For instance, an audio alert can be provided via the speaker in the power switch. A visual alert can be provided via one or more indicators (e.g., light ring, night light, etc.). A visual alert can also be provided by controlling one or more lighting devices powered by the power switch. An alert can be provided by communicating data from the power switch to another device over a communication link. For instance, data associated with an alert can be communicated to a user device. The user device can then provide an audio alert, visual alert (e.g., via a graphical user interface), haptic alert, etc.

In some embodiments, the power switch can include a near field communication (NFC) tag. The near field communication tag can allow for pairing of the power switch with another device (e.g., a user device) for communication without the need, for instance, for a pairing code. The NFC tag can be located, for instance, behind the rocker button allowing it to be positioned at the front of the power switch. This can allow for the NFC tag to be interfaced with by a NFC compatible user device.

In some embodiments, the power switch can include an ambient light sensor. Signals from the ambient light sensor can be used, for instance, to implement control actions (e.g., control of power delivery to one or more powered loads) based on the ambient lighting in a space. In some embodiments, the ambient light sensor can be located, for instance, behind a Fresnel lens.

In some embodiments, the power switch can include a passive infrared (PIR) sensor. The PIR sensor can be located, for instance, behind a Fresnel lens disposed on the front of the power switch. The PIR sensor can be used, for instance, to detect motion in vertical and/or horizontal directions. This can be used for gesture based control of the power switch.

In some embodiments, gesture control can allow a user to operate the power switch without having to physically touch the power switch. As an example, a user can turn the power switch on to deliver power to a powered load by moving their hand from the bottom of the power switch in a vertical direction toward the top of the powered switch. The user can turn the power switch off to interrupt power to a powered load by moving their hand from the top of the power switch in a vertical direction toward the bottom of the power switch. Dimming of the powered switch can be accomplished, for instance, by spinning fingers in a clockwise or counterclockwise direction in front of the power switch. Other suitable non-touch gestures can be used without deviating from the scope of the present disclosure.

In some embodiments, the one or more processors can obtain data indicative of an active listening mode trigger condition. For instance, the data can be obtained via the one or more microphones of the power switch. Alternatively or additionally, the data can be obtained via the passive infrared (PIR) sensor. In this manner, the data indicative of the active listening mode trigger condition can include audio input received via the one or more speakers and/or hand gesture data obtained via the PIR sensor. In response to detecting the active listening mode trigger condition, the one or more processors can be configured to change an operating mode of the power switch from a passive listening mode to an active listening mode. When the power switch is operating in the active listening mode, the one or more microphones of the power switch can be activated to detect one or more voice commands provided by a user.

Figure 2:
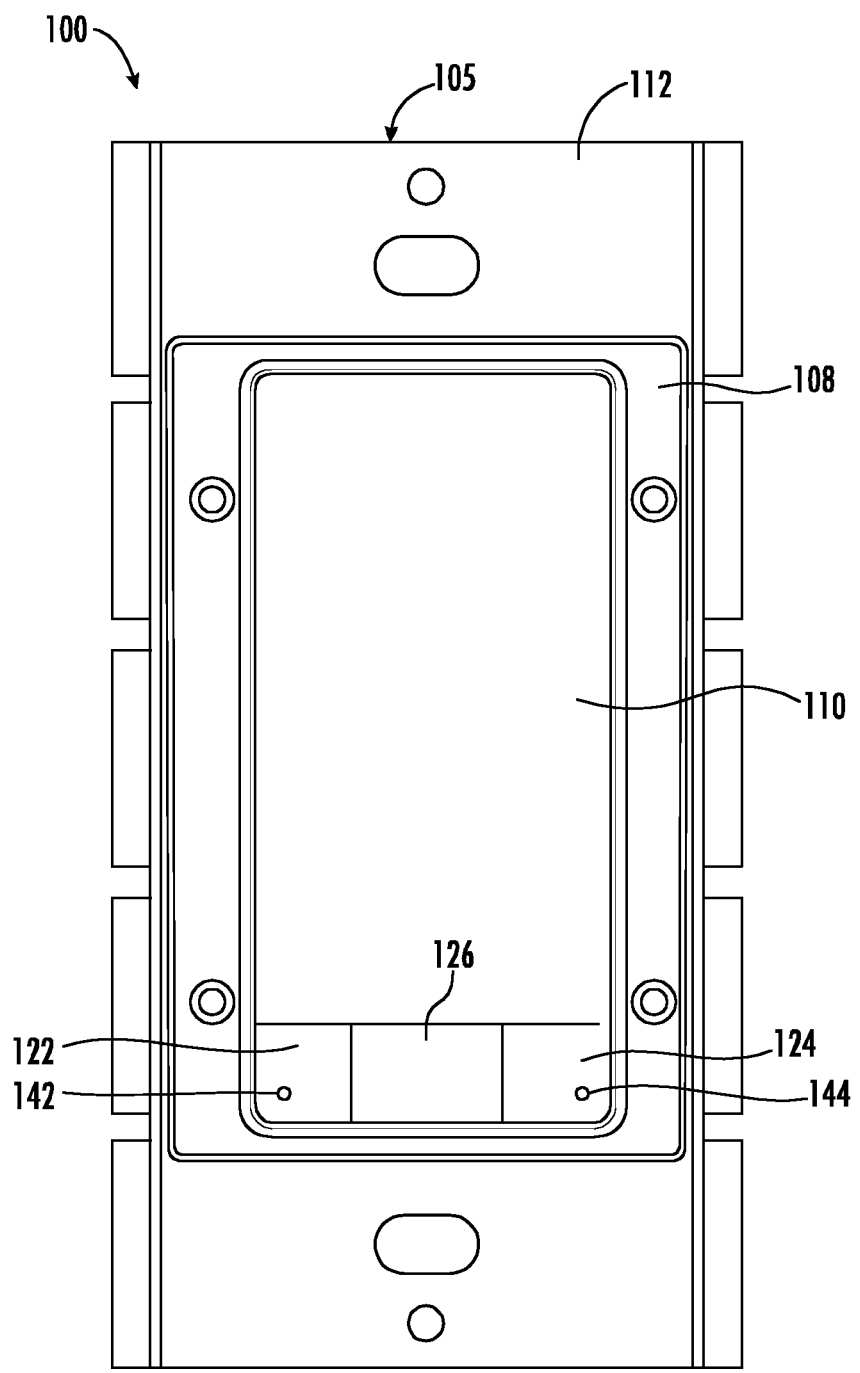
FIG. 2 depicts a front view of an example power switch according to example embodiments of the present disclosure.
Figure 3:
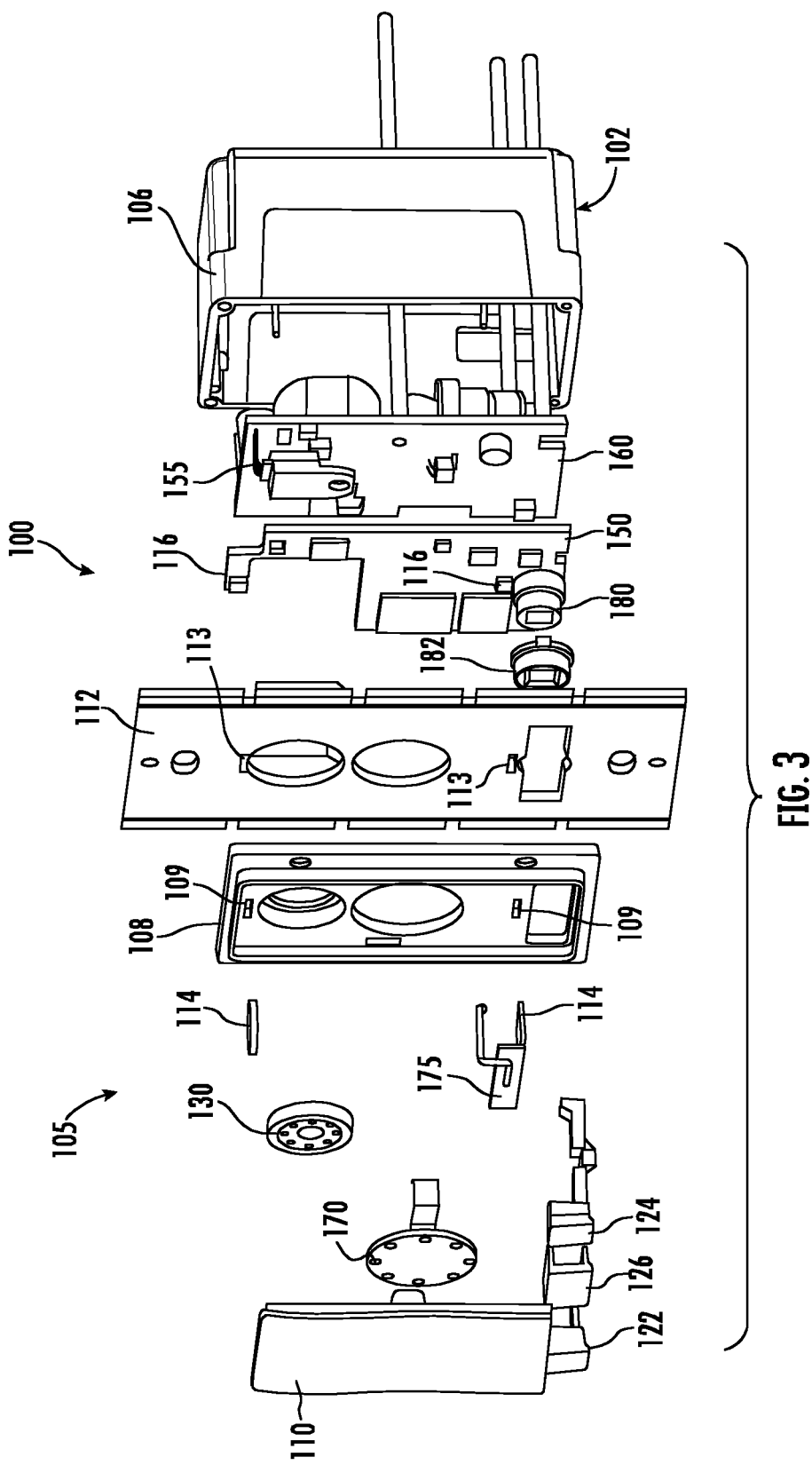
FIG. 3 depicts an exploded view of an example power switch according to example embodiments of the present disclosure.

With reference now to the FIGS., example embodiments of the present disclosure will now be set forth. FIGS. 1-3 depict an example power switch 100 according to example embodiments of the present disclosure. FIG. 1 depicts a perspective view of the power switch 100. FIG. 2 depicts a front view of the power switch 100. FIG. 3 depicts an exploded view of the power switch 100.

The power switch 100 can be an in-wall device mountable on or at least partially within a surface, such as a wall, floor, panel, ceiling, or other surface. The power switch 100 includes a housing 102. The housing 102 houses and/or includes one or more components of the power switch 100. The housing 102 can include a front panel 105 and a frame 106. The front panel 105 can be a visible portion of the power switch 100 when installed on or at least partially within a surface. The frame 106 can house various components of the power switch 100, such as one or more circuit boards 150, 160 having electronic components associated with the power switch 100.

One or more of the circuit boards 150 and 160 can include various electronic components associated with the power switch 100, such as one or more processors, one or more memory devices, one or more circuits for wireless communication, and other components. Example electronic components associated with the power switch 100 will be discussed with reference to FIG. 10.

Referring still to FIGS. 1-3, the power switch 100 can receive conductors 202, 204, and 206 for delivery of power to one or more powered loads. For instance, power can be delivered from a power source (e.g., breaker, panel, etc.) to the power switch 100 via conductors 204 and 206. In some embodiments, conductor 204 can be a hot conductor. Conductor 206 can be a neutral conductor. Conductor 202 can be a load conductor (e.g., load wire) used to deliver power to one or more powered loads (e.g., lighting fixtures, electronic devices, powered outlets, appliances, machinery, etc.).

The power switch 100 can control delivery of power to one or more powered loads via conductor 202 via a power interrupter. The power interrupter controls whether power is delivered via conductor 202. In the example embodiment of the power switch 100 shown in FIGS. 1-3, the power interrupter is a thyristor 155 (e.g., a TRIAC). When the thyristor 155 is in a first state, power is conducted to the one or more powered loads via conductor 202. When the thyristor 155 is in a second state, power is not conducted to the one or more powered loads via conductor 202.

Aspects of the present disclosure are discussed with reference to a thyristor power interrupter for purposes of illustration and discussion. Other suitable devices and/or components can be used to control power delivery via conductor 202 without deviating from the scope of the present disclosure, such as power semiconductors, relays, contactors, mechanical switches, etc.

The state of the thyristor 155 can be controlled based on various inputs. For instance, the state of the thyristor 155 can be controlled based on a user input received at an interface element, such as rocker button or switch 110 of the power switch 100. The state of the thyristor 155 can also be controlled based on signals received from other devices (e.g., user devices such as a smartphone, tablet, wearable device, laptop, display with one or more processors) received over a communication link.

For instance, referring still to FIGS. 1-3, the front panel 105 can include a rocker button 110, paddle housing 108, and heat sink 112. The rocker button 110 can be received into the paddle housing 108. The rocker button 110 can be rotatable about an axis passing through the center of the rocker button 110 so that the rocker button 110 can be rotated in a first direction when the user presses a top portion of the rocker button 110 and can be rotated in a second direction when the user presses a bottom portion of the rocker button 110.

The rocker button 110 can interface with rocker plungers 114. Rocker plungers 114 can pass through apertures 109 defined in the paddle housing 108 and apertures 113 defined in the heat sink 112. The rocker plungers 114 can engage actuators 116 located on circuit board 150. The actuators 116 can provide signals for the control of thyristor 155 based on user input via the rocker button 110. For instance, when a user presses the rocker button 110 to rotate the rocker button 110 in a first direction, the thyristor 155 can be controlled to be in a first state to allow the delivery of power via conductor 202 to one or more powered loads. When a user presses the rocker button 110 to rotate the rocker button 110 in a second direction, the thyristor 155 can be controlled to be in a second state to stop the delivery of power via conductor 202 to one or more powered loads.

As shown in FIGS. 1-3, the front panel 105 can further include a first button 122 and a second button 124. A Fresnel lens 126 can be disposed between the first button 122 and the second button 124. A user can interact with the first button 122 and the second button 124 to control various operations of the power switch 100.

In some embodiments, the first button 122 can be a pairing button. More particularly, a user can interact with the first button 122 (e.g., depress and/or pull out the first button 122) to initiate a pairing sequence with another device, such as a powered load, another power switch, or a user device. A pairing sequence is used to enable communication between the power switch 100 and another device. For instance, the pairing sequence can be used to allow for communication between the power switch 100 and another device using a direct peer to peer communication protocol. Any of a number of suitable interactions (e.g., sequence of user interactions) via the first button can be used to initiate a pairing sequence without deviating from the scope of the present disclosure.

In some embodiments, the second button 124 can be an air gap switch. User interaction with the air gap switch can be used to remove power from the power switch 100 and/or the one or more powered loads. In some embodiments, the user can interact with the second button 124 by pulling the second button 124 away from the front panel 105. The second button 124 can be associated with a long plunger arm such that when the second button 124 is pulled away from the front panel 105, power to the power switch 100 and one or more connected loads is removed. In some embodiments, the user can interact with the second button 124 by pushing the second button 124 towards the front panel 105. For example, the user can push the second button 124 towards the front panel 105 to perform one or more functions. As one example, the one or more functions can include activating the digital voice assistant service.

Figure 4:
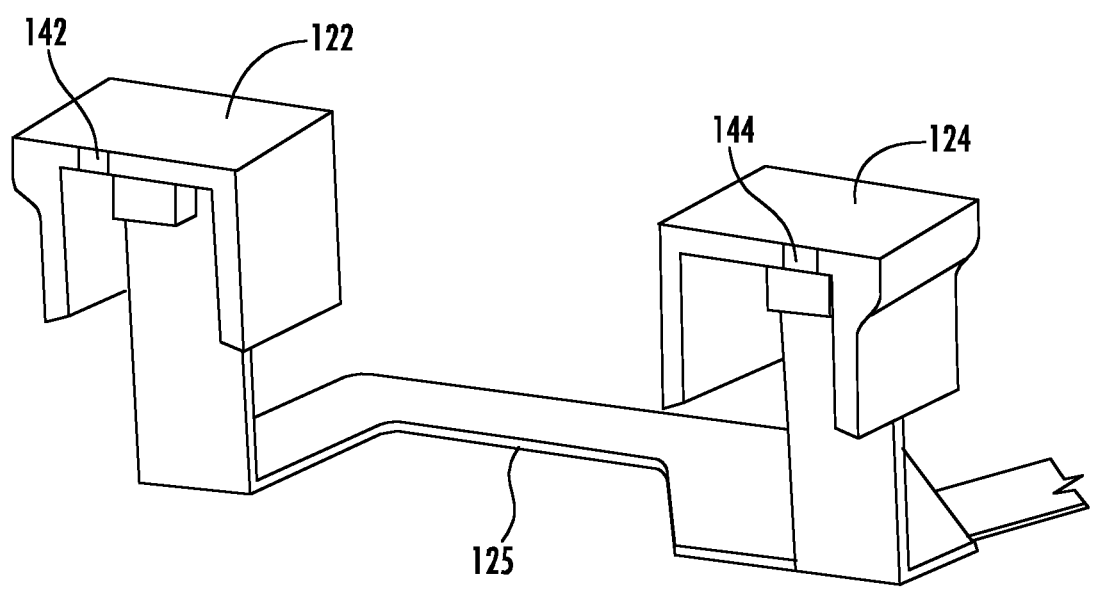
FIG. 4 depicts a first button and second button assembly of a power switch according to example embodiments of the present disclosure.

FIG. 4 depicts a perspective view of an example assembly including a first button 122 and second button 124 according to example embodiments of the present disclosure. As shown, the first button 122 and the second button 124 can be coupled to a single flex board 125. The single flex board 125 can be connected to the printed circuit board 150 (shown in FIG. 3) using a single connection point, reducing complexity of the power switch 100.

Referring now to FIGS. 1-4, the power switch 100 can include a first microphone 142 and a second microphone 144. The first microphone 142 can be disposed in the first button 122. The second microphone 144 can be disposed in the second button 124. The first microphone 142 can be sealed in plastic. The first microphone 142 can be coupled to a printed circuit board 150 using a flexible printed circuit (FPC) cable that allows the first button 122 to be pressed up and down while still maintaining a connection to printed circuit board 150. The second microphone 144 can be coupled to a printed circuit board 150 using a flexible printed circuit (FPC) cable that allows the second button 124 to be pressed up and down while still maintaining a connection to printed circuit board 150.

Audio data received at the first microphone 142 and/or the second microphone 144 can be communicated to one or more processors (e.g., on the power switch 100 and/or remote from the power switch 100). The audio data can be processed to provide audio responsive functionality as described in more detail below.

In some embodiments, the first microphone 142 and/or the second microphone 144 can each be covered with a film. More specifically, the film can be comprised of a water-resistant material. In this manner, the film can prevent moisture from getting through to the microphones 142, 144.

Figure 5:
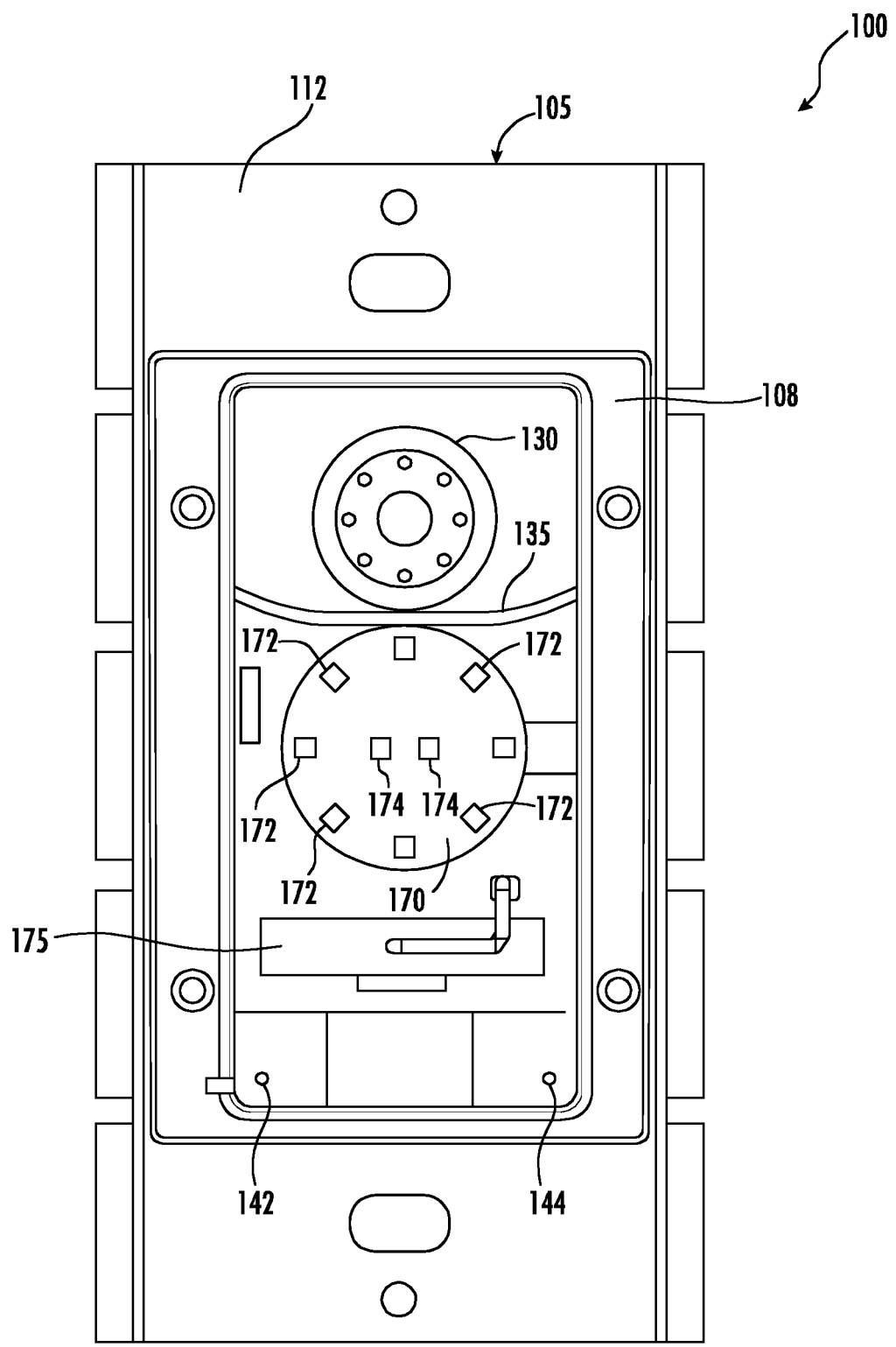
FIG. 5 depicts a front view of an example power switch with a rocker button removed according to example embodiments of the present disclosure.

FIG. 5 depicts the example power switch 100 of FIGS. 1-3 with the rocker button 110 removed. As shown, the power switch 100 includes an antenna 175. The antenna 175 can be used for wireless transmitting and receiving data and other signals over one or more communication links. The antenna 175 is positioned behind the rocker button 110 to provide for increased communication capability. This can be important when the power switch 100 is installed in a metal electrical box (e.g., single gang, double gang, triple gang, etc.). Locating the antenna 175 as far forward as possible can allow the antenna 175 to remain outside of the metal electrical box. In this manner, a reduction in signal strength can be prevented.

In some embodiments, the antenna 175 can be a multi-band antenna capable of transmitting and/or receiving information over multiple frequency bands so that data and other signals can be communicated to other devices using different protocols and/or communication channels. For instance, the antenna 175 can be configured for communication over both a Wi-Fi band (e.g., about 2.4 GHz) and a Bluetooth band (e.g., about 5 GHz). As used herein, the use of the term "about" in conjunction with a numerical value is intended to refer to within 20% of the stated amount.

Referring still to FIG. 5, the power switch 100 can include an audio output device, such as speaker 130. The speaker 130 can be circular in shape. The speaker 130 can be disposed behind the rocker button 110. The speaker 130 can be accommodated in a recess defined in the paddle housing 108. The speaker 130 can be configured to provide audio output as will be described in more detail below. In some embodiments, the speaker 130 can include a ported speaker box. In some embodiments, the speaker 130 can include a sealed cavity speaker box. In some embodiments, the speaker 130 can be a 20 mm speaker.

In some embodiments, the power switch 100 can include a sound deflector 135. The sound deflector 135 can deflect sound emanating from the speaker 130 away from the first microphone 142 and the second microphone 144. The sound deflector 135 can be disposed around a bottom portion of the speaker 130. The sound deflector 135 can reduce the amount of sound that is projected downwards toward the first microphone 142 and the second microphone 144. This can increase the performance of audio echo cancellation.

Figure 6:
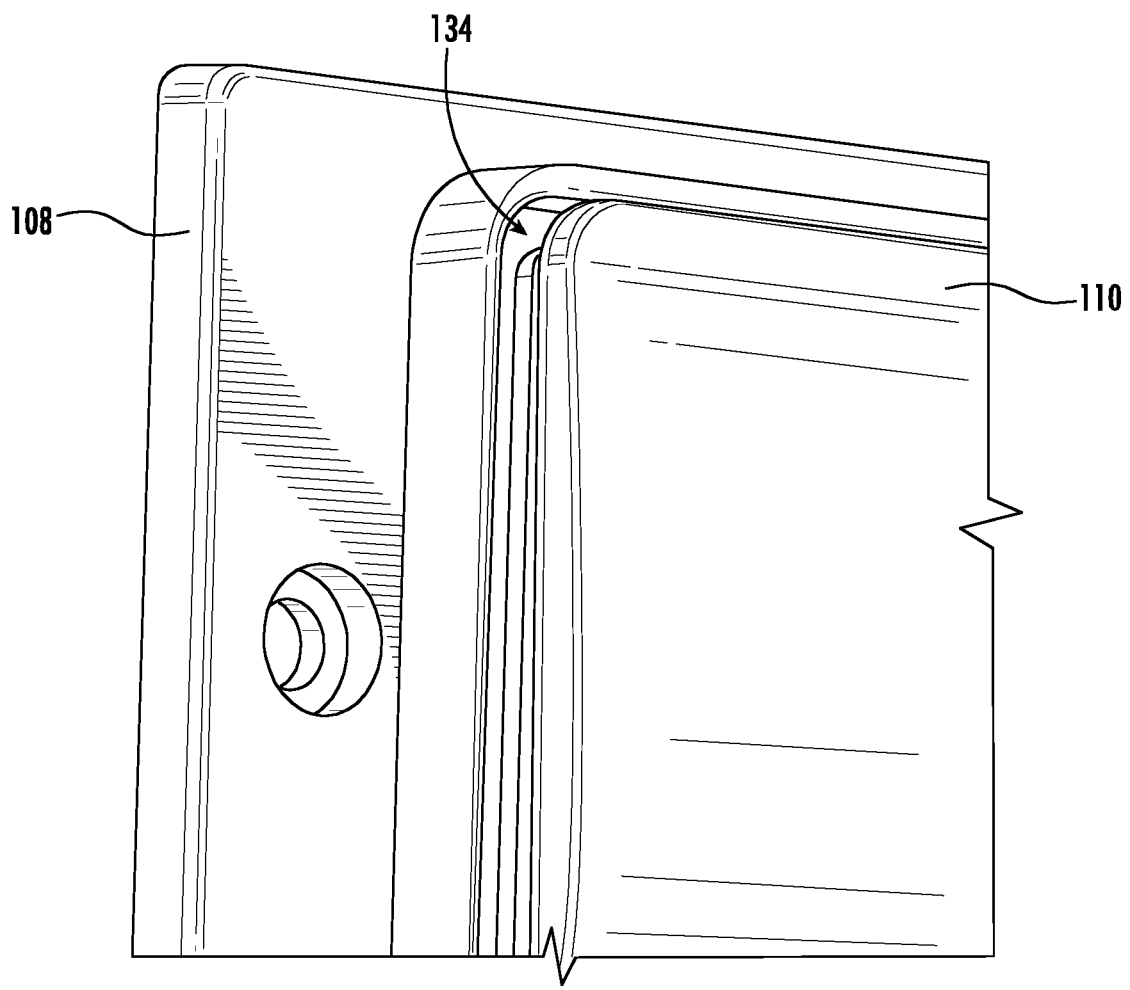
FIG. 6 depicts an example sound gap defined between a rocker button and a paddle housing according to example embodiments of the present disclosure.

As shown in FIG. 6, in some embodiments, a gap can be defined between the interface element (e.g., rocker button 110) and the paddle housing 108 in the front panel 105 of the power switch 100. For instance, FIG. 6 depicts a close up of a portion 213 of the power switch 100 shown in FIG. 1. As shown, a gap 134 is defined around at least a portion of the edge of the rocker button 110 and the paddle housing 108. The gap 134 can be a "sound gap" that allows sound to emanate from the speaker 130 behind the rocker button 110.

Referring again to FIG. 5, the power switch 100 can include an LED board 170. The LED board 170 can include a plurality of LEDs for providing indicators via the rocker button 110. More particularly, the rocker button 110 can be made from a material such that the rocker button 110 diffusely transmits light emitted from the plurality of LEDs to the front of the rocker button 110 to provide one or more indicators. For instance, the rocker button 110 can be formed from a plastic material that can act as both a light pipe and a light diffuser. In some embodiments, a light blocking housing can extend from the LED board 170 to the rocker button 110 to prevent light bleeding.

Referring particularly to FIG. 5, the LED board 170 can include an LED ring 172 having a plurality of LEDs arranged in a ring. The LED ring 172 can be used to provide a light ring indicator. The LED board 170 can also include LEDs 174 in a center portion of the LED board 170 within the LED ring 172 that can be used to function as a night light indicator.

Figure 7:
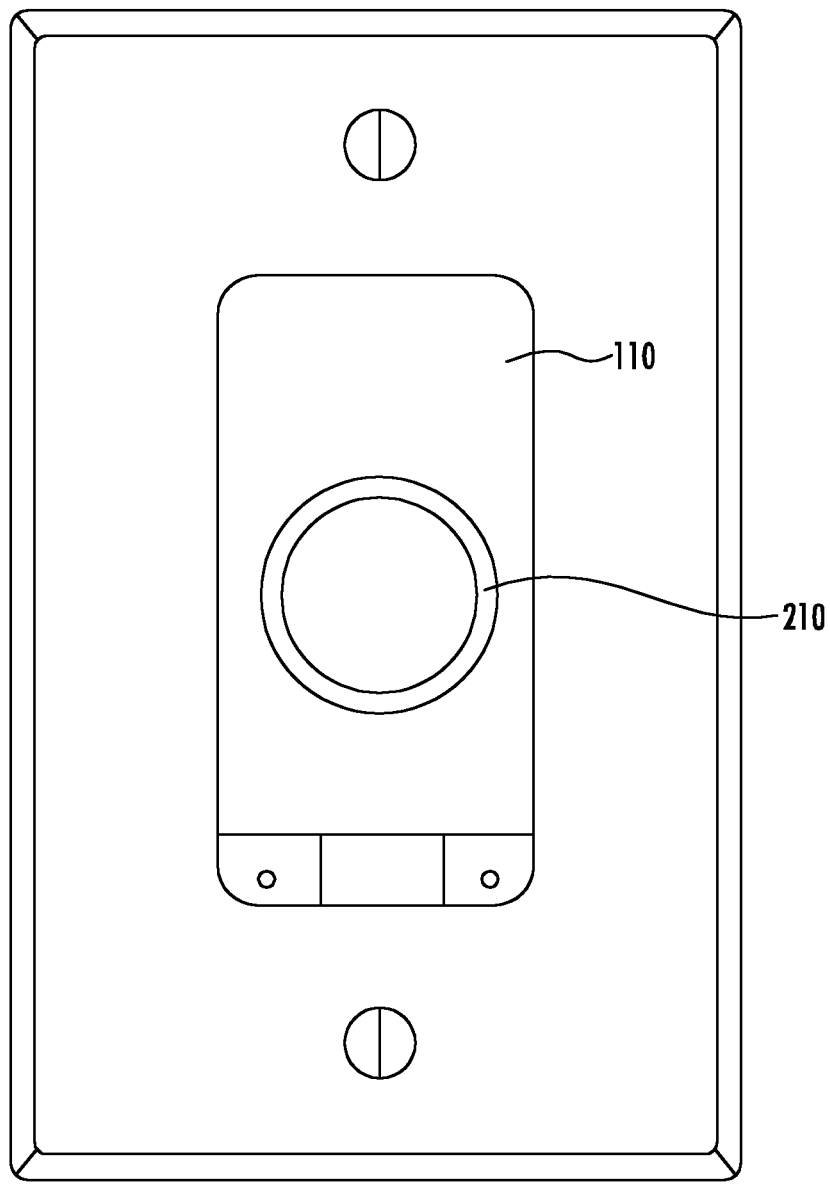
FIG. 7 depicts an example light ring indicator on a rocker button according to example embodiments of the present disclosure.

FIG. 7 depicts a front view of an example power switch with a light ring indicator 210 illuminated on the rocker button 110 according to example embodiments of the present disclosure. The light ring indicator 210 can be displayed in response to one or more voice commands received at the power switch 100. For instance, the light ring indicator 210 can be used in conjunction with implementation of a digital voice assistant service.

As an example, the light ring indicator 210 can be displayed when a voice command is detected. Various animations can be implemented using the light ring indicator 210 in response to the voice command. For instance, during completion of the voice command, the light ring indicator 210 can be controlled to provide a rotating ring animation. Once the voice command is completed, the light ring indicator 210 can be turned off. When the light ring indicator 210 is turned off, the light ring indicator 210 is invisible.

In some embodiments, the light ring indicator 210 can be displayed when a user is in proximity to the power switch 100 as detected by one or more sensors (e.g., a PIR sensor). The presence of the light ring indicator 210 can provide an indication that the power switch 100 is ready to receive and respond to a voice command from the user. Other suitable configurations of an indicator can be used without deviating from the scope of the present disclosure.

Figure 8:
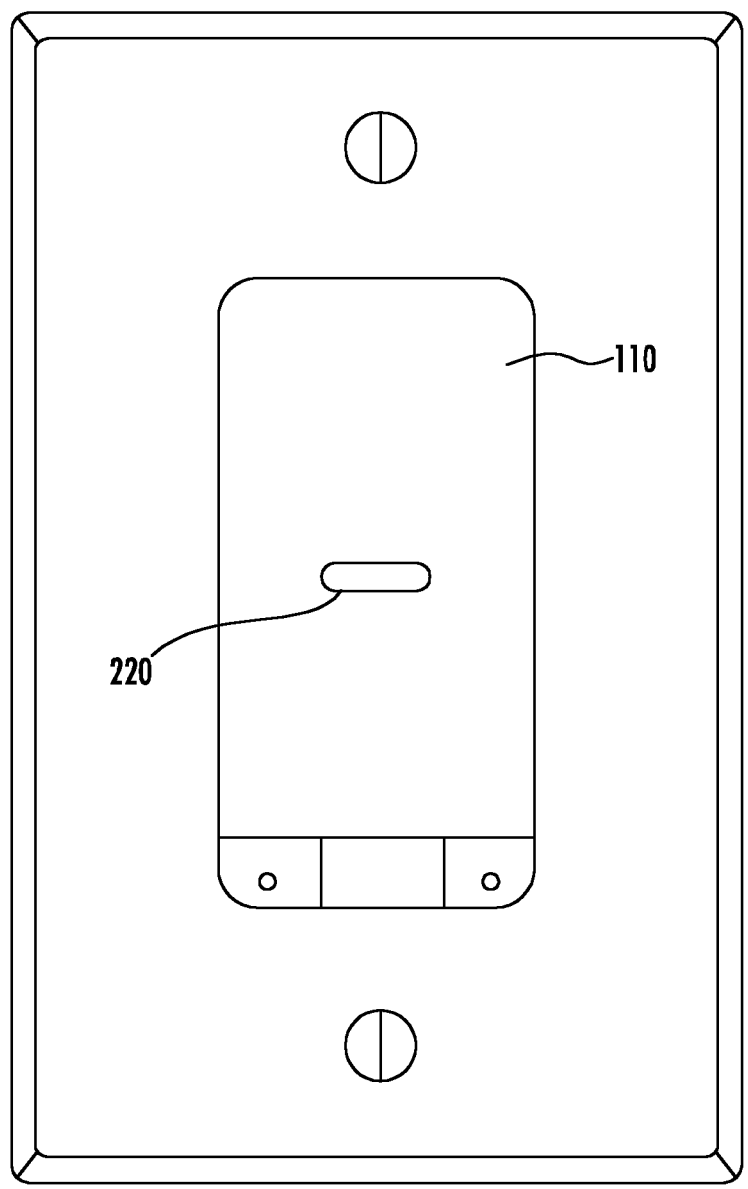
FIG. 8 depicts an example night light indicator on a rocker button according to example embodiments of the present disclosure.

FIG. 8 depicts a front view of an example power switch with a night light indicator 220 illuminated on the rocker button 110 according to example embodiments of the present disclosure. The night light indicator 220 is illustrated as a horizontal bar. However, other suitable configurations of the night light indicator 220 can be used without deviating from the scope of the present disclosure.

The night light indicator 220 can be normally on, allowing for ambient lighting. In some embodiments, the night light indicator 220 can be illuminated when an ambient light sensor (e.g., located behind Fresnel lens 126) determines that light in a space has fallen below a threshold. In this way, the night light indicator 220 can help a user easily locate the power switch 100 in reduced lighting.

Referring again to FIGS. 1-3, the power switch 100 can include one or more sensors located behind the Fresnel lens 126. For instance, the power switch 100 can include a passive infrared (PIR) sensor 180. The PIR sensor 180 can be coupled to the printed circuit board 150. A PIR cover 182 can be disposed over the PIR sensor 180. The PIR sensor 180 can be used, for instance, to detect motion in a vertical and/or horizontal direction.

In some embodiments, the PIR sensor 180 can be used to detect contactless user gestures in front of the power switch 100 to allow a user to operate the power switch 100 without contacting the power switch 100. Example hand gestures can include vertical swipes in front of the power switch 100. An upward vertical swipe can be used to place the power switch 100 in a first state to allow the delivery of power to one or more powered loads. A downward vertical swipe can be used to place the power switch 100 in a second state to stop the delivery of power to one or more powered loads. Circular hand gestures in a clockwise and/or counterclockwise direction can be used to control dimming of, for instance, one or more light sources powered by the power switch 100. Other example hand gestures can be used to generate actions for the power switch 100. In addition, other sensors, such as capacitive sensors, can be used to detect hand gestures without deviating from the scope of the present disclosure.

The power switch 100 can further include an ambient light sensor (not illustrated) disposed behind the Fresnel lens 126. The ambient light sensor can be used to detect ambient lighting in a space. Signals indicative of ambient lighting can be used by the power switch 100 for a variety of purposes. For instance, the power switch 100 can illuminate a night light indicator when ambient light drops below a threshold. The power switch 100 can automatically turn on or turn off a light source powered by the power switch 100 based on the detected ambient light. The power switch 100 can be placed into one or modes of operation (e.g., a listening mode) based at least in part on the detected ambient light.

Figure 9:
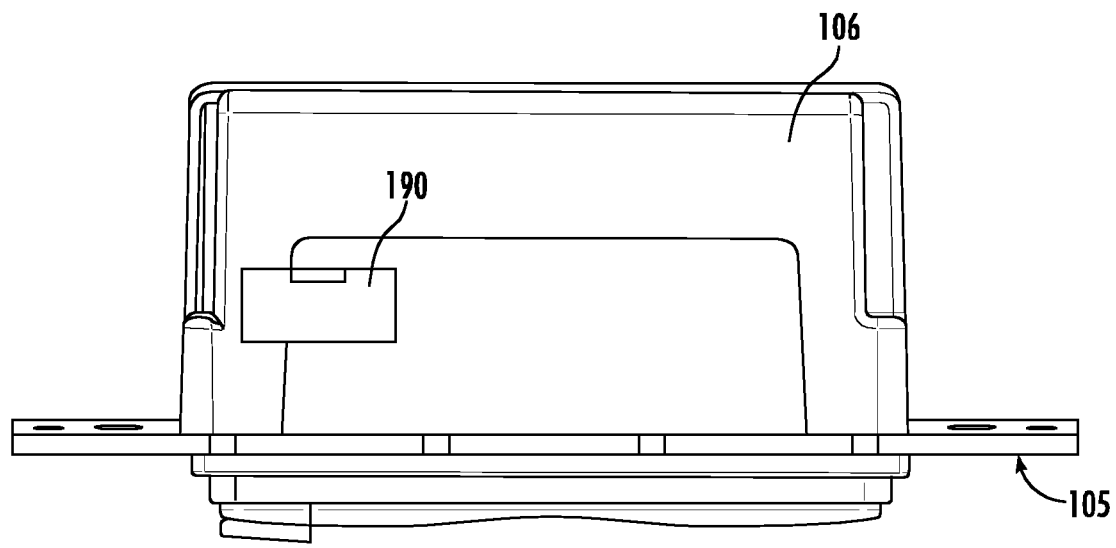
FIG. 9 depicts an example access door for gaining access to program a power switch according to example embodiments of the present disclosure.

FIG. 9 depicts a side view of an example power switch 100 according to example embodiments of the present disclosure. As illustrated in FIG. 9, the frame 106 of the power switch 100 can include an access door 190. The access door 190 can allow for access to a programming header on a printed circuit board disposed within the frame 106. A user can plug into the programming header to program the power switch 100 and/or otherwise modify software, firmware, or other computer-readable instruction executed by one or more processors on the power switch 100. In this way, the access door 190 can allow for easy access for technicians to program the power switch 100 without disassembly. In some embodiments, a tamper resistant sticker can be placed over the door to hide appearance of the access door 190. A torn sticker can be indicative of unauthorized access to the power switch 100 via the access door 190. In some embodiments, the frame 106 can includes a series of holes that are configured to accommodate access for a programming header for programming the power switch 100

Figure 10:
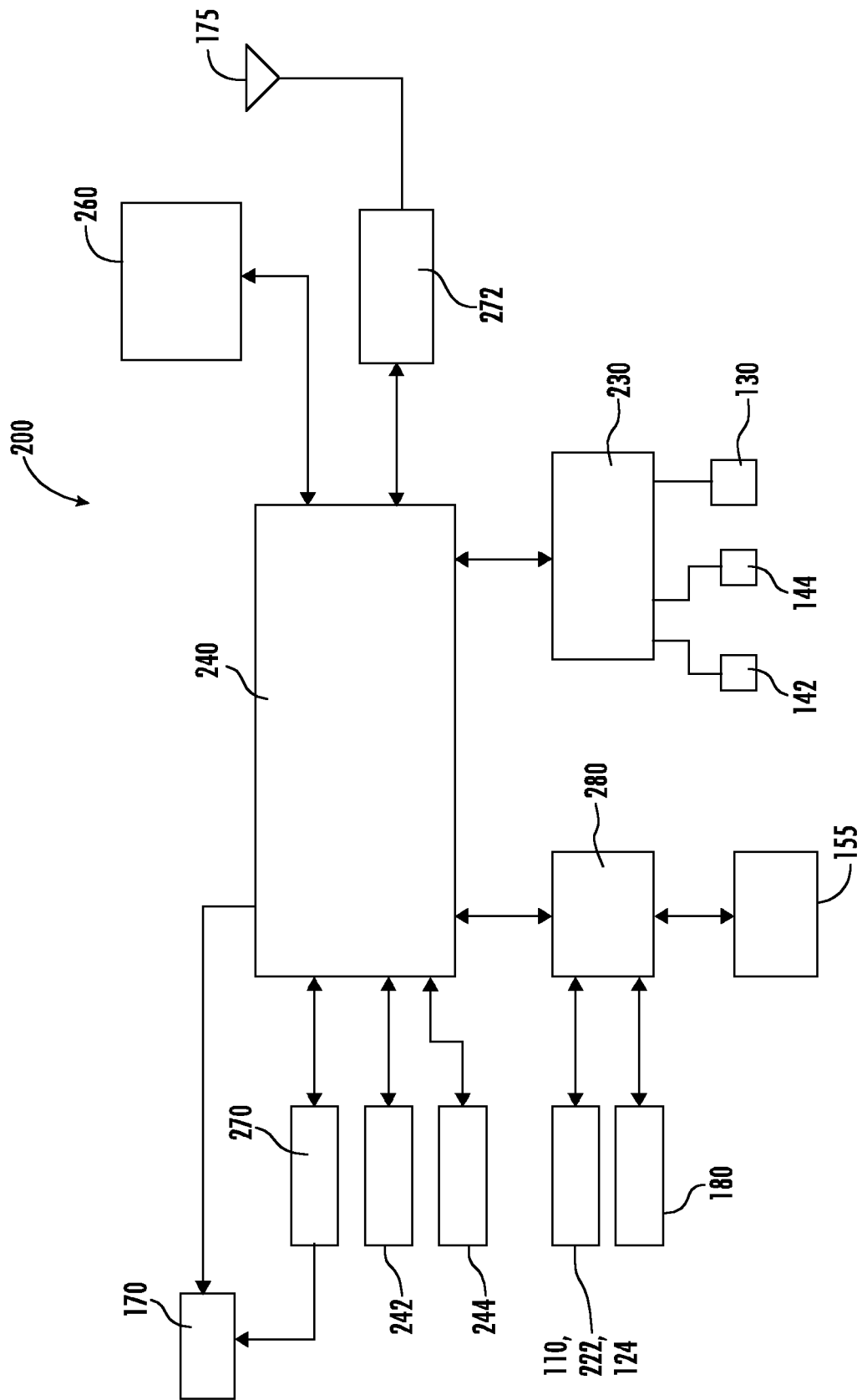
FIG. 10 depicts a block diagram of example components of a power switch according to example embodiments of the present disclosure.

FIG. 10 depicts a block diagram of an example control system 200 of an example power switch 100 according to example embodiments of the present disclosure. The control system includes one or more processors 240 and one or more memory devices 260. For instance, the one or more processors 240 can include dual (e.g., two) processors. Alternatively, the one or more processors 240 can include quad (e.g., four) processors.

The one or more processors 240 can be any suitable processing device, such as microprocessors, integrated circuits (e.g., application specific integrated circuits), field programmable gate arrays, etc. that perform operations to control components (e.g., any of the components described herein). The one or memory devices 260 can be any suitable media for storing computer-readable instructions and data. For instance, the one or more memory devices 260 can include random access memory such as dynamic random access memory (DRAM), static memory (SRAM) or other volatile memory. In addition, and/or in the alternative, the one or more memory devices can include non-volatile memory, such as ROM, PROM, EEPROM, flash memory, optical storage, magnetic storage, etc.

Figure 12:
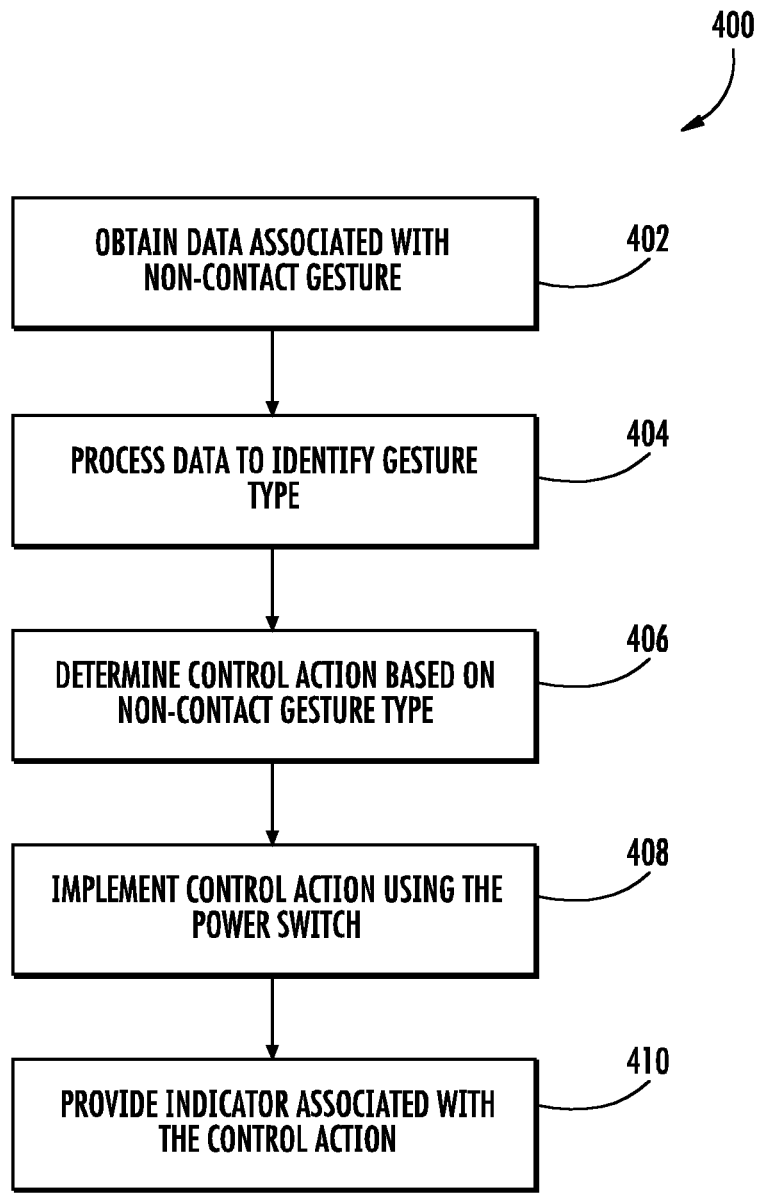
FIG. 12 depicts a flow diagram of an example method according to example embodiments of the present disclosure.
Figure 13A:
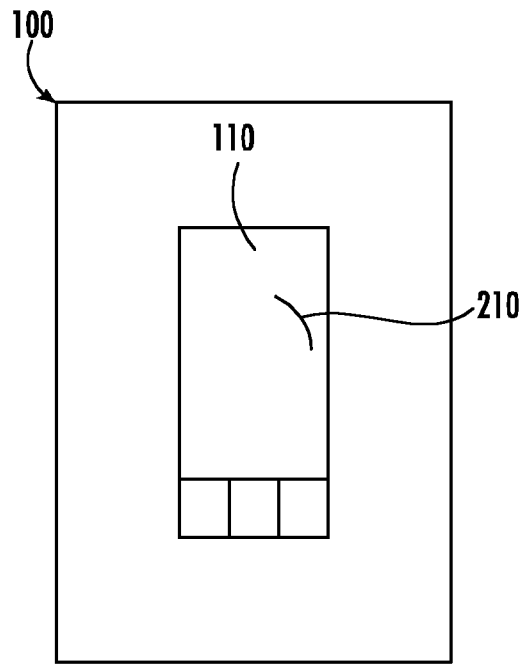
FIG. 13A depict an example indicator for display on a power switch according to example embodiments of the present disclosure.
Figure 13B:
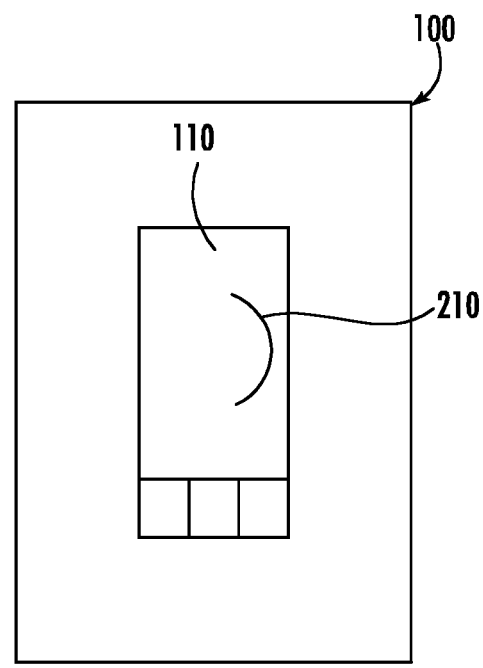
FIG. 13B depict an example indicator for display on a power switch according to example embodiments of the present disclosure.
Figure 13C:
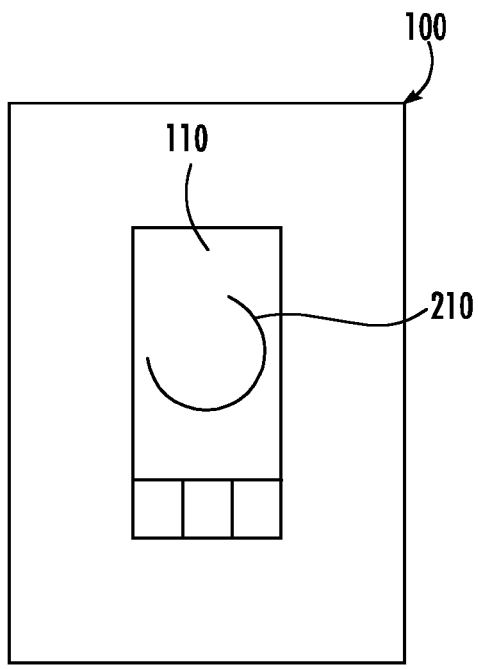
FIG. 13C depict an example indicator for display on a power switch according to example embodiments of the present disclosure.
Figure 13D:
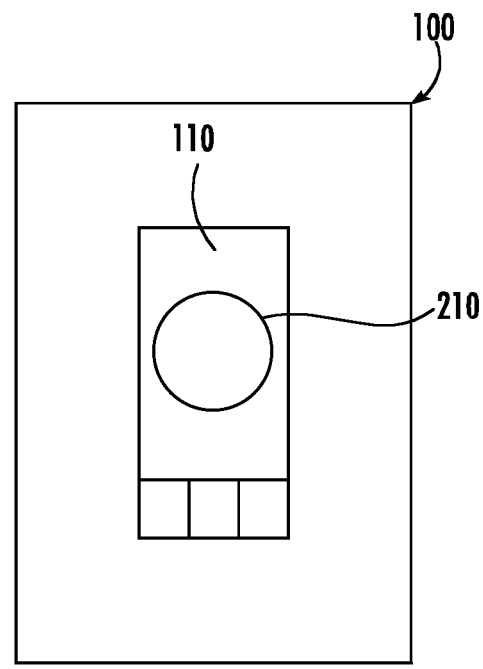
FIG. 13D depict an example indicator for display on a power switch according to example embodiments of the present disclosure.

The one or more memory devices 260 can store computer-readable instructions that, when executed by the one or more processors 240, cause the one or more processors 240 to perform operations, such as any of the operations described herein (e.g., the methods discussed in FIGS. 12 and 13). The instructions can be software written in any suitable programming language or can be implemented in hardware.

The one or more memory devices 260 can also store data that can be obtained, received, accessed, written, manipulated, created, and/or stored. As an example, the one or more memory devices 260 can store data associated with one or more classifier models (e.g., machine learned classifier models) that can be used to classify audio data received at the power switch 100 as one or more sounds (e.g., smoke alarm, breaking glass, etc.). Storing the classifier model(s) locally in the one or more memory devices 260 can allow for local processing of audio data to identify potential out of band conditions.

Referring still to FIG. 10, the one or more processors 240 can be in communication with and/or can be configured to control operation of audio circuitry 230. The audio circuitry 230 can be configured to receive and process audio data received from, for instance, first microphone 142 and second microphone 144. The audio circuitry 230 can also provide audio output for speaker 130. In some embodiments, the audio circuitry 230 can include one or more of a digital signal processor (DSP), codec, amplifier, etc. For instance, the audio circuitry 230 can be a low power smart Codec with dual core audio DSP. In some embodiments, the audio circuitry 230 can include a CS47L24 Smart Codec with Dual Core DSP manufactured by Cirrus Logic.

In some embodiments, the one or more processors 240 can be in communication with and/or can be configured to control operation of a microcontroller 280. The microcontroller 280 can be configured to control the TRIAC 155 and/or provide signals to processor(s) 240 for control of components based on inputs received via interface elements on the power switch 100, such as the rocker button 110, the first button 122, the second button 124, or other interface elements. The microcontroller 280 can also receive signals from PIR sensor 180. The signals from the PIR sensor 180 can be processed for gesture based control (e.g., non-contact gesture based control) of the power switch 100. In some embodiments, the microcontroller 280 can be a STM32F031G4U6 Microcontroller manufactured by STMicroelectronics.

The one or more processors 240 can be in communication with and/or can be configured to control operation of a power meter 244. The power meter 244 can measure voltage and/or current flowing through a load wire passing through the power switch 100. Current can be measured, for instance, using a sense resistor. Voltage can be measured using, for instance, a voltage divider. Power flowing through the load wire can be computed (e.g., using one or more processors 240 located on the power switch 100 and/or remote from the power switch 100) based on the measured current and voltage. In some embodiments, the power meter can be a STPM32 metering circuitry manufactured by STMicroelectronics.

The one or more processors 240 can be in communication with an ambient light sensor 242. Signals from the ambient light sensor 242 can be used, for instance, by the processor(s) 240 to implement control actions (e.g., control of power delivery to one or more powered loads) based on the ambient lighting in a space. In some embodiments, the ambient light sensor 242 can be a LTR-329ALS-01 digital light sensor manufactured by Mouser Electronics The one or more processors 240 can be in communication with an LED driver circuit 270 and a LED board 170 to control operation of an indicator for the power switch 100. The LED driver circuit 270 can provide power to the LED board 170 for driving the plurality of LEDs. The one or more processors 240 can control emission of light from one or more LEDs on the LED board 170 to provide various indicators (e.g., light ring, night light, etc.) as described herein. In some embodiments, the LED driver circuit 270 can be a IS31FL3235 LED driver manufactured by Integrated Silicon Solution, Inc.

The one or more processors 240 can be in communication with a communication interface 272. The communication interface 272 can allow for the communication of data via, for instance, one or more wireless links using the antenna 175. The communication interface 272 can include any circuits, components, software, etc. for communicating over various communication links (e.g., networks). In some implementations, the communication interface 272 can include for example, one or more of a communications controller, receiver, transceiver, transmitter, port, conductors, software, and/or hardware for communicating data. In some embodiments, the communication interface 272 can include a SX-SDPAC module manufactured by Silex Technology.

Example communication technologies and/or protocols can include, for instance, Bluetooth low energy, Bluetooth mesh networking, near-field communication, Thread, TLS (Transport Layer Security), Wi-Fi (e.g., IEEE, 802.11), Wi-Fi Direct (for peer-to-peer communication), Z-Wave, ZigBee, HaLow, cellular communication, LTE, low-power wide area networking, VSAT, Ethernet, MoCA (Multimedia over Coax Alliance), PLC (Power-line communication), DLT (digital line transmission), etc. Other suitable communication technologies and/or protocols can be used without deviating from the scope of the present disclosure.

Figure 11:
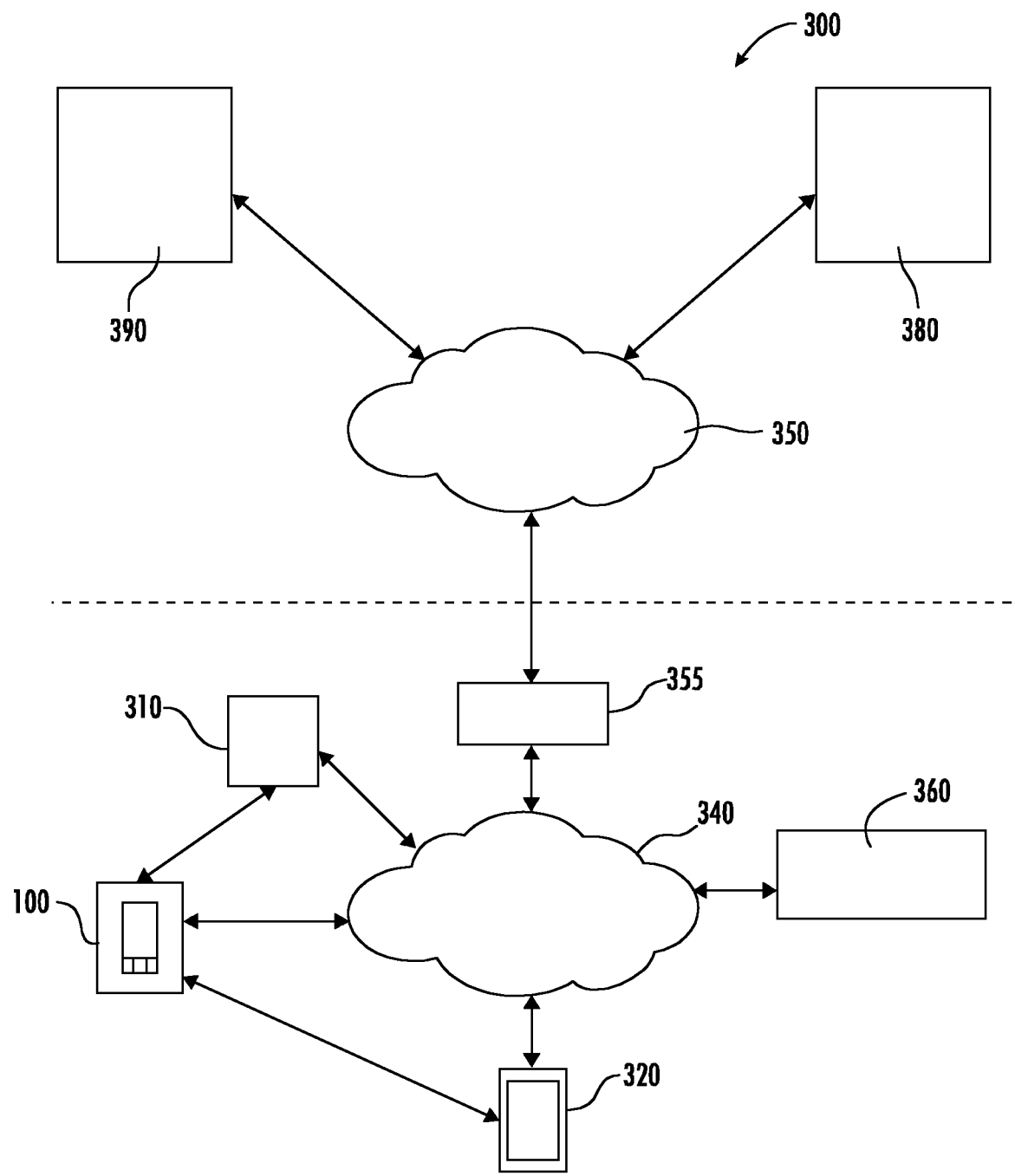
FIG. 11 depicts an example computing environment used in conjunction with a power switch according to example embodiments of the present disclosure.

FIG. 11 depicts an example computing environment 300 in which the power switch 100 can be integrated according to example embodiments of the present disclosure. As shown, the power switch 100 can be in communication with various devices, such as powered load 310 and/or one or more user devices 320, 360. The powered load 310 can be any device powered by the power switch 100, such as one or more lighting fixture or other light sources, appliances, electronics, consumer devices, ceiling fans, machinery, systems, or other powered loads. User devices 320, 360 can be, for instance, one or more smartphones, laptops, desktops, tablets, wearable devices, media devices, displays with one or more processors, or other suitable devices.

The power switch 100 can be in communication with the powered load 310, for instance, via a direct communication link (e.g., direct wired or wireless communication link) or via a network, such as local area network 340. The direct communication link can be implemented, for instance, using Bluetooth low energy or other suitable communication protocol. The power switch 100 can control delivery of power to the powered load 310 via a load conductor. In some embodiments, the power switch 100 can provide control signals to control operation of the powered load (e.g., fan speed, dimming level, etc.) via the direct communication link.

The power switch 100 can be in communication with user devices 320, 360 for instance, via a direct communication link (e.g., direct wired or wireless communication link) or via a network, such as local area network 340. The direct communication link can be implemented, for instance, using Bluetooth low energy or other suitable communication protocol. In some embodiments, a user can control, view information, and/or specify one or more settings associated with the power switch 100 via a graphical user interface implemented on a display of the user device 320, 360. For instance, a user can access an application implemented on the user device 320. The application can present a graphical user interface on a display of the user device 320. A user can interact with the graphical user interface to control operation of the power switch 100 and/or one or more powered loads 310.

The local area network 340 can be any suitable type of network or combination of networks that allows for communication between devices. In some embodiments, the network(s) can include one or more of a secure network, Wi-Fi network, IoT network, mesh network, one or more peer-to-peer communication links, and/or some combination thereof, and can include any number of wired or wireless links. Communication over the network 340 can be accomplished, for instance, via a communication interface using any type of protocol, protection scheme, encoding, format, packaging, etc.

The computing environment 300 can include a gateway 355 that can allow access to a wide area network 350. The wide area network 350 can be, for instance, the Internet, cellular network, or other network, and can include any number of wired or wireless links. Communication over the wide area network 350 can be accomplished, for instance, via a communication interface using any type of protocol, protection scheme, encoding, format, packaging, etc. As shown, the power switch 100 can communicate information over the network 350 to remote computing systems 380 and 390 and other remote computing systems via the gateway 355.

The computing environment 300 can include remote computing systems 380. The remote computing systems 380 can be associated with a cloud computing platform for implementation of one or more services for the power switch 100. Data collected by the cloud computing platform can be processed and stored and provided, for instance, to a user device 320 (e.g., for presentation in a graphical user interface).

The computing environment 300 can include remote computing systems 390. The remote computing systems 390 can be associated with a service accessed by the power switch 100, such as a digital audio assistant service. Audio data collected by the power switch 100 can be communicated to the remote computing systems 390 for processing of voice commands. Data responsive to the voice commands can be communicated to the power switch 100 for output (e.g., by speaker 130) and/or to user device 320 (e.g., for display in a graphical user interface). In this way, the power switch 100 can act as a source for voice commands for digital voice assistant services.

The remote computing systems 380 and 390 can include one or more computing devices (e.g., servers) having one or more processors and one or more memory devices. The computing systems 380 and 390 can be distributed such that its components are located in different geographic areas. The technology discussed herein makes reference to computer-based systems and actions taken by and information sent to and from computer-based systems. One of ordinary skill in the art will recognize that the inherent flexibility of computer-based systems allows for a great variety of possible configurations, combinations, and divisions of tasks and functionality between and among components. For instance, processes discussed herein may be implemented using a single computing device or multiple computing devices working in combination. Databases, memory, instructions, and applications may be implemented on a single system or distributed across multiple systems. Distributed components may operate sequentially or in parallel.

FIG. 12 depicts a flow diagram of an example method 400 for controlling a power switch according to example embodiments of the present disclosure. The method 400 can be implemented, for instance, using power switch 100 and/or one or more aspects of the computing environment 300 of FIG. 11. FIG. 12 depicts steps performed in a particular order for purposes of illustration and discussion. Those of ordinary skill in the art, using the disclosure provided herein, will understand that various steps of any of the methods described herein can be omitted, expanded to include other steps, performed simultaneously, rearranged, and/or modified in various ways without deviating from the scope of the present disclosure.

At (402), the method 400 can include obtaining data associated with a non-contact gesture. The data associated with a non-contact gesture can include, for instance, signals from a motion sensor, such as a PIR sensor. As one example, a PIR sensor located behind a Fresnel lens in a power switch can send signals to one or more processors on the power switch and/or one or more processes on a remote device via a communication interface. The signals can be processed to determine whether the signals are indicative of a non-contact gesture in front of the power switch. A non-contact gesture refers to a gesture that is implemented without touching the power switch.

At (404), the method 400 can include processing the data to identify a gesture type. For instance, the data can be processed by one or more processors on the power switch and/or remote from the power switch to determine whether the data is indicative of a vertical swipe gesture, a horizontal swipe gesture, a circular swipe gesture, or other gesture.

At (406), the method 400 can include determining a control action based on the non-contact gesture type. For instance, a look-up table, function, correlation matrix, or other data or model can associate one or more control action with different gesture types. As an example, a vertical swipe can be associated with toggling power on and off to a powered device. A horizontal swipe can be associated with changing a mode of operation of the power switch and/or accessing settings for the power switch. A circular swipe can be associated with, for instance, dimming one or more light sources or controlling power flow to one or more powered devices (e.g., increasing or decreasing power).

At (408), the method 400 can include implementing the control action using the power switch. For instance, the one or more processors in the power switch can control a power interrupter (e.g., TRIAC) to control power delivery to one or more powered devices. The one or more processors can control the power switch to enter a different mode of operations (e.g., a passive listening mode to an active listening mode). Other suitable control actions can be implemented without deviating from the scope of the present disclosure.

At (410), the method 400 can include providing an indicator associated with the control action. For instance, the one or more processors can control one or more LEDs on an LED board to present a light ring indicator (e.g., with various animations) to signify a response to the non-contact gesture. For instance, a light ring indicator can appear to signify to the user that the power switch is implementing a control action in response to a non-contact gesture.

In some embodiments, a sub portion of the light ring indicator can be displayed (e.g., on the rocker button) to be indicative of the dimming level and/or other setting (e.g., fan speed). A quarter of the ring light indicator can be displayed when the light sources are dimmed to about 25% of full power or fan speed is reduced to about 25% of full speed. A half of the light ring indicator can be displayed when the light sources are dimmed to about 50% of full power or fan speed is at about 50% of full speed. Three quarters of the light ring indicator can be displayed when the light sources are dimmed to about 75% of full power or fan speed is reduced to about 75% of full speed. The full light ring can be displayed when the light sources are at full power or the fan is operating at full speed.

More particularly, FIGS. 13A, 13B, 13C and 13D depict the example display of indicators on an in-wall device (e.g., power switch 100) according to example embodiments of the present disclosure. In the example shown in FIG. 13A, the power switch 100 can be configured to display a quarter portion of a light ring indicator 210 when the light sources are dimmed to a first level or fan speed is at a first speed. In the example shown in FIG. 13B, the power switch 100 can be configured to display a half portion of a light ring indicator 210 when the light sources are dimmed to a first level or when the ceiling fan is operating at a second speed (e.g., medium speed). In the example shown in FIG. 13C, the power switch 100 can be configured to display a three-quarter portion of a light ring indicator 210 when the light sources are dimmed to a third level or when the ceiling fan is operating at a third speed (e.g. high speed). In the example shown in FIG. 13D, the power switch 100 can be configured to display a full light ring indicator 210 when the light sources are operated at full power or when the ceiling fan is operating at full speed.

Other suitable indicators indicative of operating parameters of the powered load can be displayed without deviating from the scope of the present disclosure. For example, in another embodiment, the power switch 100 can be configured to display one-third of a light ring indicator 210 when the light sources are dimmed to a first level or when the ceiling fan is operating at a first speed (e.g., low speed). The power switch 100 can be configured to display two-thirds of a light ring indicator 210 when the light sources are dimmed to a second level or when the ceiling fan is operating at a second level (e.g., medium speed). The power switch 100 can be configured to display a full light ring indicator 210 when the light sources are dimmed to a third level (e.g., full power) or when the ceiling fan is operating at a third speed (e.g., full speed).

In some embodiments, a user can control dimming of one or more light sources based on interaction with the light ring indicator 210. For instance, a user can touch or place a finger, hand, or other stylus or device near the light ring indicator 210. The user can perform a tracing motion about or near the light ring indicator 210 in a first direction (e.g., clockwise) to increase a dimming level of one or more light sources powered by the power switch. The user can perform a tracing motion about or near the light ring indicator 210 in a second direction (e.g., counterclockwise) to decrease dimming level of the one or more light sources powered by the power switch.

As another example, a user can control fan speed of one or more fans powered by the power switch based on interaction with the light ring indicator 210. For instance, a user can touch or place a finger, hand, or other stylus or device near the light ring indicator 210. The user can perform a tracing motion about or near the light ring indicator 210 in a first direction (e.g., clockwise) to increase a fan speed of one or more fans powered by the power switch. The user can perform a tracing motion about or near the light ring indicator 210 in a second direction (e.g., counterclockwise) to decrease fan speed of one or more fans powered by the power switch.

Figure 14:
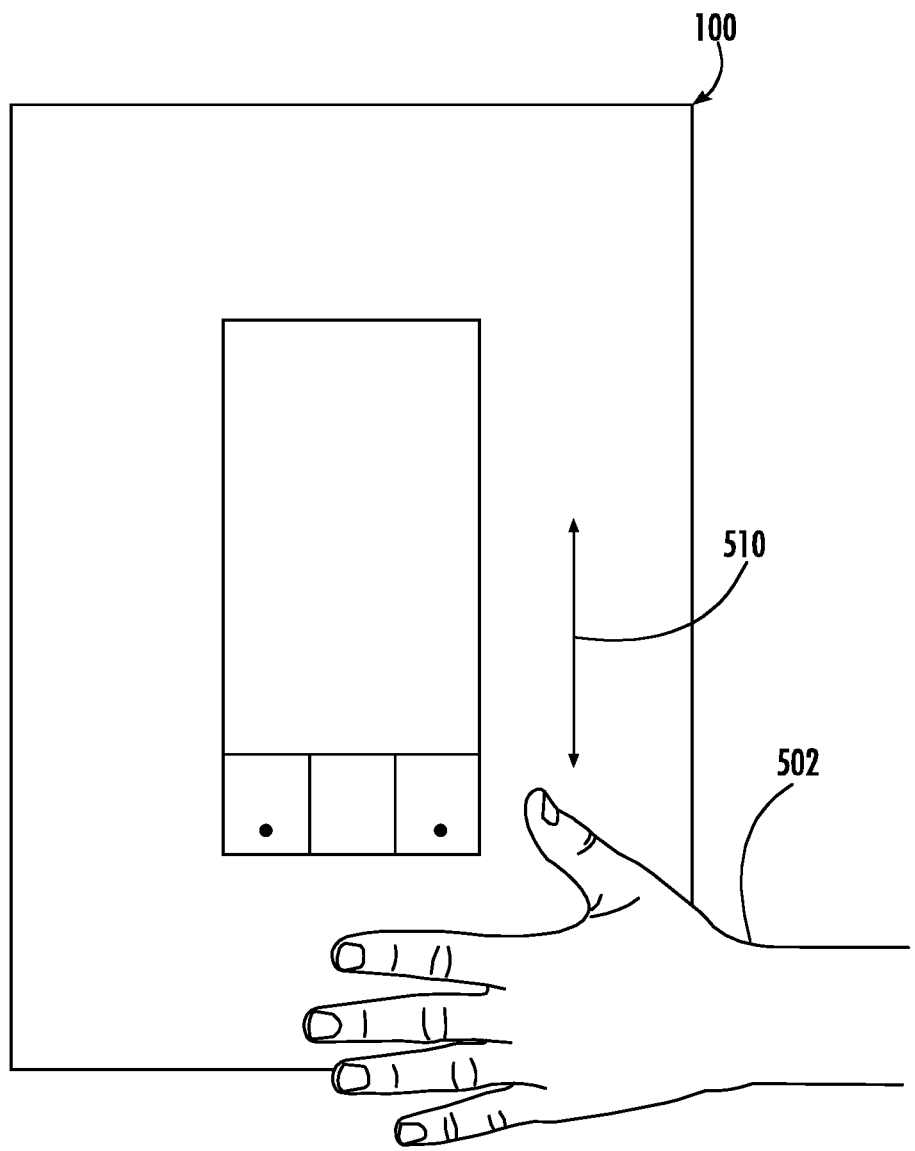
FIG. 14 depict an example non-contact hand gesture for controlling a power switch according to example embodiments of the present disclosure.

FIG. 14 depicts a representation of an example non-contact gesture to control a power switch 100 according to example aspects of the present disclosure. For instance, a user can move a hand 502 or other item in front of the power switch 100 in a vertical swipe 510. Signals from a PIR sensor located, for instance, behind a Fresnel lens can be processed to identify the vertical swipe 510. The power switch 100 can toggle power to a powered load based on the vertical swipe 510. For instance, a vertical swipe in the up direction can toggle power on to the powered load. A vertical swipe in the down direction can toggle power off to the powered load.

Figure 15:
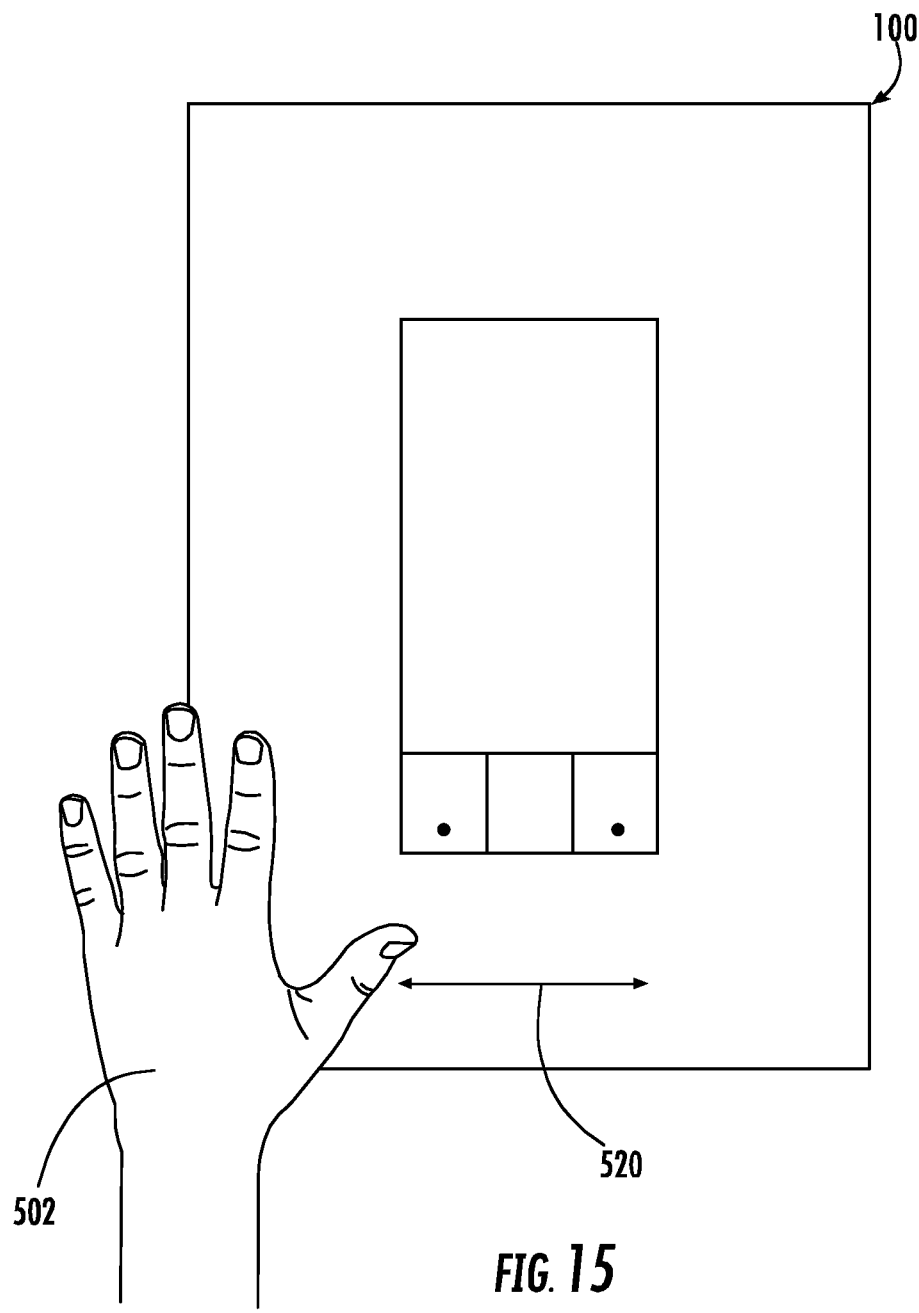
FIG. 15 depicts an example non-contact hand gesture for controlling a power switch according to example embodiments of the present disclosure.

FIG. 15 depicts a representation of an example non-contact gesture to control power to a power switch according to example embodiments of the present disclosure. For instance, a user can move a hand 502 or other item in front of the power switch 100 in a horizontal swipe 520. Signals from a PIR sensor located, for instance, behind a Fresnel lens can be processed to identify the horizontal swipe 520. The power switch 100 can change a mode or operation or access setting of the power switch based on the horizontal swipe 520. For instance, a left horizontal swipe can change the power switch from a passive listening mode to an active listening mode for receipt of one or more voice commands or other data for use in, for instance, a digital audio assistant service. A right swipe can allow a user to access settings associated with the power switch (e.g., for pairing to other devices, controlling the color of one or more indicators, etc.). In some embodiments, the setting can be adjusted using voice commands provided from the user after providing the horizontal swipe.

Figure 16:
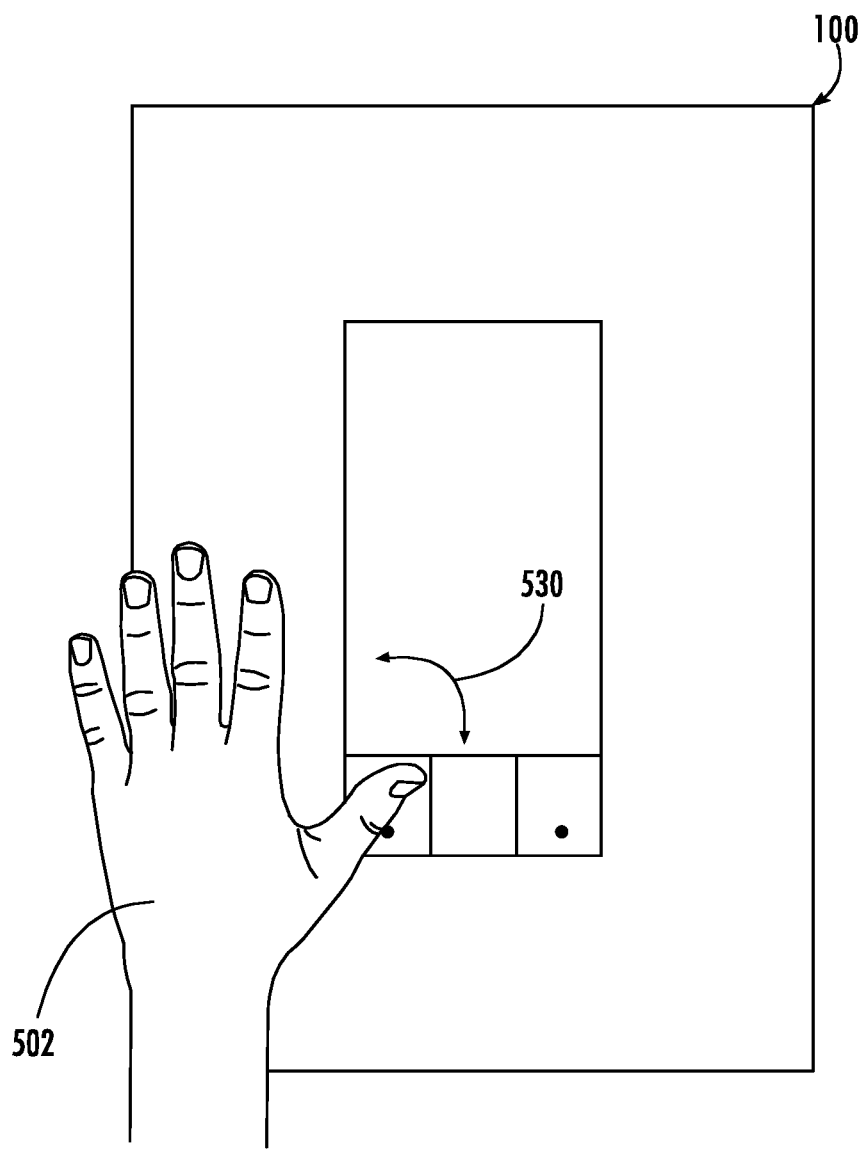
FIG. 16 depicts an example non-contact hand gesture for controlling a power switch according to example embodiments of the present disclosure.

FIG. 16 depicts a representation of an example non-contact gesture to control power to a power switch according to example embodiments of the present disclosure. For instance, a user can move a hand 502 or other item in front of the power switch 100 in a circular swipe 530. Signals from a PIR sensor located, for instance, behind a Fresnel lens can be processed to identify the circular swipe 530. The power switch 100 can change adjust a dimming level or other setting (e.g., fan speed) of one or more powered loads based on the circular swipe 530. For instance, a circular swipe in a clockwise direction can increase a dimming level of one or more light sources and/or increase fan speed. A circular swipe in the counterclockwise direction can decrease a dimming level of one or more light sources and/or decrease a fan speed.

The example non-contact hand gestures in FIGS. 14-16 are provided for purposes of illustration and discussion. Those of ordinary skill in the art, using the disclosures provided herein, will understand that other suitable gestures can be used to control the power switch without deviating from the scope of the present disclosure.

Figure 17:
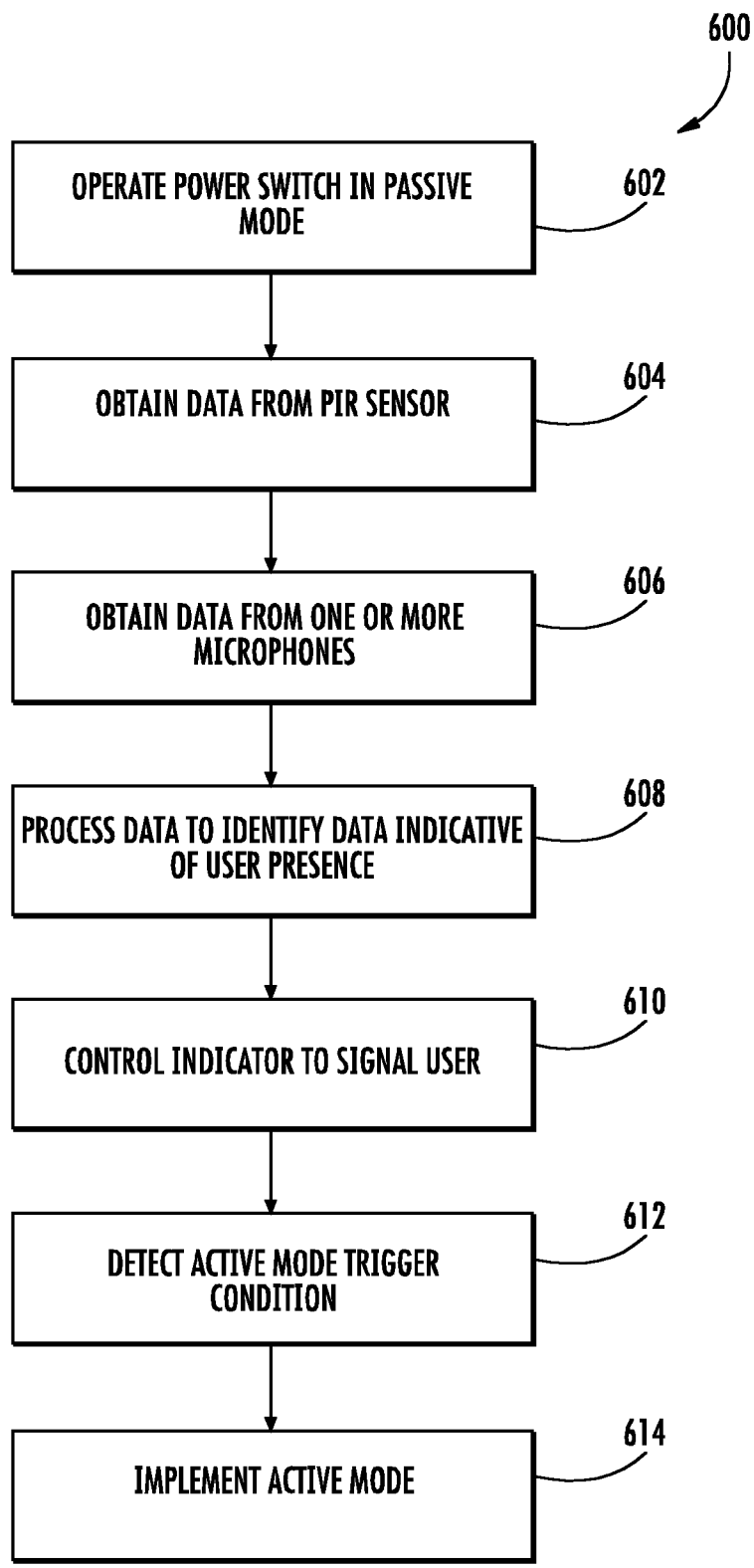
FIG. 17 depicts a flow diagram of an example method according to example embodiments of the present disclosure.

FIG. 17 depicts a flow diagram of an example method 600 for operating a power switch according to example embodiments of the present disclosure. The method 600 can be implemented, for instance, using power switch 100 and/or one or more aspects of the computing environment 300 of FIG. 11. FIG. 17 depicts steps performed in a particular order for purposes of illustration and discussion. Those of ordinary skill in the art, using the disclosure provided herein, will understand that various steps of any of the methods described herein can be omitted, expanded to include other steps, performed simultaneously, rearranged, and/or modified in various ways without deviating from the scope of the present disclosure.

At (602), the method 600 can include operating the power switch in as passive mode. In a passive mode, the power switch can be configured to process audio data to listen for trigger conditions, such as a voice prompt command, horizontal swipe and/or a trigger condition associated with an out of band condition. In some implementations, audio data is not recorded, stored, or otherwise processed (except to identify a trigger condition or user presence) when operating in the passive mode.

At (604), the method 600 can include obtaining data from a PIR sensor. For instance, the method 600 can include obtaining one or more signals from a PIR sensor disposed behind a Fresnel lens on the power switch.

At (606), the method 600 can include obtaining data from one or more microphones. For instance, the method 600 can include obtaining data associated with audio input at a first microphone and data associated with audio input at a second microphone.

At (608), the method 600 can include processing the data to determine data indicative of user presence. For instance, data from PIR sensor can be processed to identify motion of a user in a space associated with the power switch. In addition, and/or in the alternative, data from the one or more microphones can be processed to identify that a user is likely in a space associated with the power switch due to the presence of sounds from the user.

In response to determining data indicative of user present, the method 600 can include controlling an indicator to signal a user that the power switch is ready to receive audio input (e.g., a voice prompt command for triggering an active listening mode). The indicator can be, for instance, a light ring displayed on a rocker button of the power switch. As an example, the indicator can be normally off. However, when signals from a PIR sensor and/or one or more microphones are indicative of a user in the space, the indicator can be displayed to signal to the user that the power switch is ready to receive audio input (e.g., for entering an active listening mode as discussed in more detail below).

At (612), the method 600 can include detecting an active mode trigger condition. According to example aspects of the present disclosure, the active mode trigger condition can be a voice prompt command. The voice prompt command can be a preset voice command that when used is intended to invoke active listening functionality of the power switch. For instance, the voice prompt command can be a recognizable term or phrase such as "Hello Switch," "Listen Now", "Hey Power Device". In some embodiments, the voice prompt command can be associated with a digital assistant service, such as digital assistant services provided by Amazon, ("Alexa"), Apple, ("Hey Siri"), Google ("Ok Google"), or other services. Other suitable conditions can be used as the active trigger mode condition. For instance, the detection of a horizontal swipe non-contact gesture can be an active trigger mode condition.

At (614), the method 600 can include implementing an active listening mode. The active listening mode can be used to control the power switch via one or more voice commands. In addition, one or more voice commands can be used to perform functions ancillary to the power switch, such as for use in a digital audio assistant service.

Figure 18:
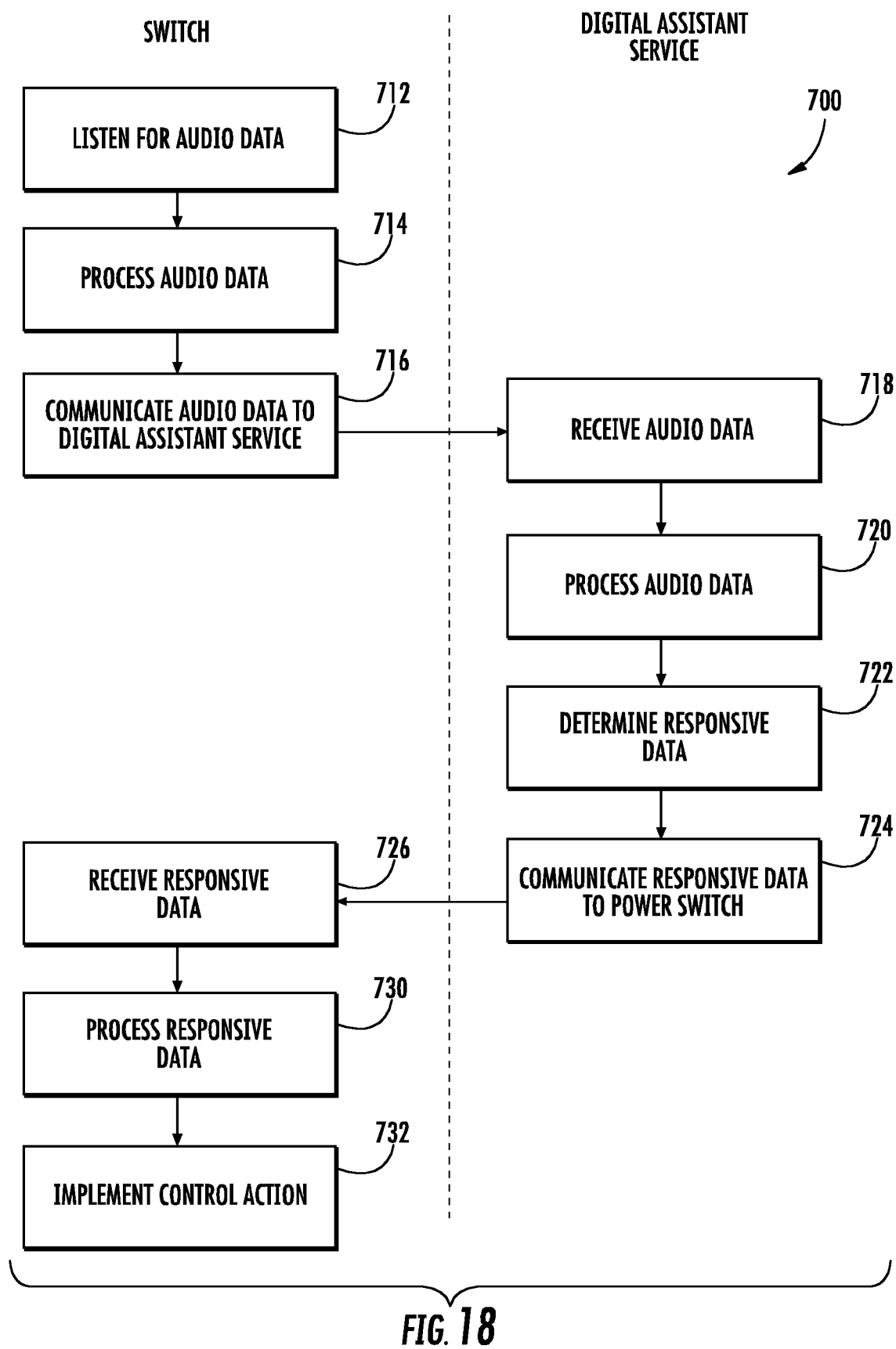
FIG. 18 depicts a flow diagram of an example method according to example embodiments of the present disclosure.

FIG. 18 depicts a flow diagram of an example method 700 associated with an active listening mode according to example embodiments of the present disclosure. At (712), the power switch can be controlled to listen for audio data via one or more microphones. In addition, one or more indicators (e.g., a light ring indicator with animations) can be provided to the user to signify that the power switch is operating in an active listening mode.

At (714), the audio data can be processed at the power switch. For instance, the audio data can be formatted into one or more data packets for communication to a digital audio assistant service.

At (716), the audio data can be communicated to a digital assistant service (e.g., via an API). In some embodiments, aspects of the digital assistant service can be implemented locally at the power switch and/or at a device (e.g., a cloud computing system) remote from the digital assistant service.

The digital assistant service can receive the audio data at (718). The digital assistant service can process the audio data using speech recognition algorithms to identify one or more voice commands from a user at (720).

At (722), the digital assistant service can determine responsive data to the voice commands. The responsive data can be any data used by the digital assistant service to respond to the voice commands or other audio data. For instance, the responsive data can include a text string of the voice command provided by the user. The responsive data can include data associated with a voice response to be played to a user (e.g., via a speaker in the power switch) to respond to the user's voice command. The responsive data can include data responsive to the request by the user provided via the voice command. For instance, if the user asked for the weather via a voice command, the responsive data can include the weather. If a user asked to set a reminder, the responsive data can include a confirmation that the reminder was set in the user's calendar. The above examples are provided by way of example. Responsive data can include data associated with any of a number of diverse actions capable of being implemented using a digital assistant service. The responsive data can be communicated to the power switch at (724).

At (726), the responsive data can be received at the power switch. The responsive data can be processed at (730) to determine one or more control actions based on the voice command or audio data received at the power switch during the active listening mode. The control actions can include, for instance, controlling power delivery to one or more powered devices, playing back a voice response to a user, playing music requested by a user, or other suitable control action. For instance, the control action can include adjusting the volume of a television that is communicatively coupled with the power switch. Alternatively or additionally, the control action can include changing the channel displayed by the television. The control action can be implemented by the power switch at (732).

One example application of an active mode of a power switch can be for control of lighting in a space. For instance, a power switch can control power delivery to one or more light sources in a space. A user can cause the power switch to enter into an active mode using a preset voice command. The power switch can obtain via one or microphones an instruction from a user to "turn off the lights" when the switch is in the active mode. The power switch can communicate the audio data to the digital assistant service. The digital assistant service can process the audio data using voice recognition and send responsive data associated with turning off the lights to the power switch. The power switch can then control delivery of power to the light sources to turn off the lights. A responsive audio output (e.g., in the form of a human voice) can be provided to the user, such as "turning off lights now."

Another example application of an active mode of a power switch can be for performing actions ancillary to controlling power deliver to one or more powered devices. For instance, a user can cause the power switch to enter into an active mode using a preset voice command. The power switch can obtain via one or microphones an instruction from a user to "tell me what the weather is like" when the switch is in the active mode. The power switch can communicate the audio data to the digital assistant service. The digital assistant service can process the audio data using voice recognition and send responsive data associated with the current weather. The power switch can then provide a responsive audio output (e.g., in the form of a human voice) to the user, such as "it is sunny and 65 degrees."

Figure 19:
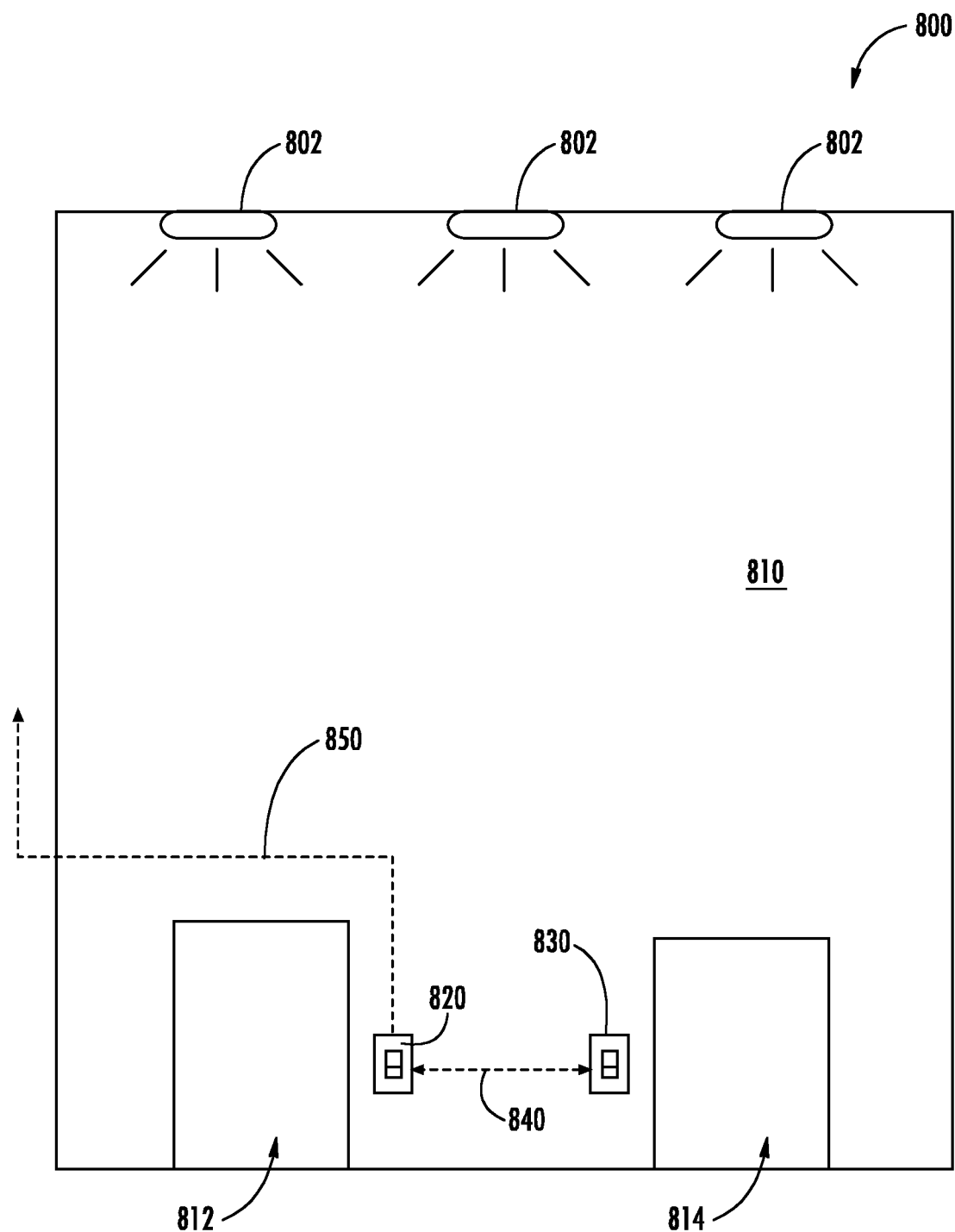
FIG. 19 depicts an example lighting system incorporating a plurality of power switches according to example embodiments of the present disclosure.

FIG. 19 depicts an example lighting system 800 incorporating a plurality of power switches according to example embodiments of the present disclosure. The lighting system 800 includes a plurality of lighting fixtures 802 (e.g., luminaires) operable to provide illumination for a space 810 (e.g., a room). The lighting system 800 can include a first power switch 820 and a second power switch 830. The first power switch 820 and/or the second power switch 830 can include one or more aspects of any of the power switches described here. The first power switch 520 can be arranged near a first entrance 812 into the space 810. The second power switch 830 can be arranged near a second entrance 814 to the space 810.

The first power switch 820 and/or the second power switch 830 can be configured to control power delivery to the one or more lighting fixtures 802 (or other powered loads) to control lighting within the space 810. In some embodiments, the first power switch 820 and the second power switch 830 can provide 3-way switch functionality (or other multi-way switching functionality with other switches present, such as 4-way switch functionality).

In an example implementation, the first power switch 820 can be a master power switch. The second power switch 830 can be a slave power switch that is in communication with the first power switch over a wireless communication link 840 (e.g., Bluetooth Low Energy communication link or other suitable communication link). User interaction with the second power switch 830 can cause data to be communicated to the first power switch 820 over the communication link 840 to control light sources 802. The first power switch 820 can also be configured to communicate with other devices (e.g., user devices, cloud computing systems, servers, etc.) over a second communication link 850 via one or more networks. A user can interact remotely with the second power switch 830 by communicating with the first power switch 820, which then relays data and other information over communication link 830 to the second power switch 830. The relationship between the first power switch 820 and the second power switch 830 has been described as a master-slave relationship. However, other suitable relationships can be used (e.g., peer-to-peer) without deviating from the scope of the present disclosure.

In example embodiments, the first power switch 820 and the second power switch 830 can be paired with one another via user interaction with one or more interface elements of the first power switch 820 and the second power switch 830. For instance, in some implementations, a user can manipulate the second button 124 (FIG. 1) of the first power switch 820. More specifically, the user can move (e.g., pull) the second button 124 away from the front panel 105 (FIG. 1). After pulling the second button 124 away from the front panel 150, the user can manipulate the first button 122 (FIG. 1) of the first power switch 820. More specifically, the user can press the first button 122 (e.g., pairing button). Then, while still pressing the first button 122, the user can move (e.g., push) the second button 124 towards the front panel 105. After moving (e.g., pushing) the second button 124 towards the front panel 105, the user can continue to press the first button 122 until receiving a notification from one or more output devices of the first power switch 820. For instance, the user can continue to press the first button 122 until the LEDs 174 (FIG. 5) of the LED board 170 included in the first power switch 820 flash light having a predetermined color (e.g., blue).

After receiving the notification, the user can perform the same sequence of steps on the second power switch 830. More specifically, the user can move (e.g., pull) the second button 124 of the second power switch 830 away from the front panel 105 (FIG. 1). After pulling the second button 124 away from the front panel 150, the user can press the first button 122 (e.g., pairing button) of the second power switch 830. Then, while still pressing the first button 122, the user can move (e.g., push) the second button 124 towards the front panel 105. After moving (e.g., pushing) the second button 124 towards the front panel 105, the user can continue to press the first button 122 until receiving a notification from one or more output devices of the second power switch 830. For instance, the user can continue to press the first button 122 until the LEDs 174 of the LED board 170 included in the second power switch 830 flash light having a predetermined color (e.g., blue)

After receiving the notification (e.g., flashing blue light) from the second power switch 530, both the first power switch 820 and the second power switch 830 can provide a notification (e.g., audible, visible) to indicate that the first power switch 820 and the second power switch 830 have been successfully paired with one another. For instance, the notification can include the speaker 130 associated with the first power switch 820 and the speaker 130 associated with the second power switch 830 each emitting an audible noise (e.g., beep). More specifically, the speakers 130 can emit a predetermined number of beeps, such as 5 beeps. Alternatively or additionally, the notification can include the LEDs 174 of the first power switch 820 and the LEDs 174 of the second power switch 830 flashing a predetermined number of times (e.g., 5 times). More specifically, the LEDs 174 of the first and second power switches 820, 830 can flash green light.

Referring again to FIG. 1, the power switch 100 can be configured as a switch (e.g., fan switch) via user interaction with one or more interface elements of the power switch 100. For instance, in some implementations, a user can manipulate the second button 124 of the power switch 100 to configure the power switch 100 as a switch. More specifically, the user can move (e.g., pull) the second button 124 away from the front panel 105. After pulling the second button 124 away from the front panel 105, the user can move the rocker button 110 to a first position. Then, while still holding the rocker button 110 in the first position, the user can move (e.g., push) the second button 124 towards the front panel 105 of the power switch 100. After moving (e.g., pushing) the second button 124 towards the front panel 105, the user can continue to hold the rocker button 110 in the first position for a predetermined amount of time (e.g., 5 seconds) until the power switch 100 provides some indicia (e.g., audible, visual) indicating configuration is complete. For instance, the indicia can include an audible noise (e.g., one or more beeps) emitted via the speaker 130. Alternatively or additionally, the indicia can include the led ring 172 (FIG. 5) of the LED board 170 pulsing a predetermined number of times (e.g., 3 times).

In example embodiments, the power switch 100 can be configured as a dimmer via user interaction with one or more interface elements of the power switch 100. For instance, in some implementations, a user can manipulate the second button 124 of the power switch 100 to configure the power switch 100 as a dimmer. More specifically, the user can move (e.g., pull) the second button 124 away from the front panel 105. After pulling the second button 124 away from the front panel 105, the user can move the rocker button 110 to a first position. Then, while still holding the rocker button 110 in the first position, the user can move (e.g., push) the second button 124 towards the front panel 105 of the power switch 100. After moving (e.g., pushing) the second button 124 towards the front panel 105, the user can continue to hold the rocker button 110 in the first position for a predetermined amount of time (e.g., 5 seconds) until the power switch 100 provides some indicia (e.g., audible, visual) indicating configuration is complete. For instance, the indicia can include an audible noise (e.g., one or more beeps) via the speaker 130. Alternatively or additionally, the indicia can include the led ring 172 (FIG. 5) of the LED board (170) pulsing from 0% to 100% a predetermined number of times (e.g., 3 times).

In example embodiments, the pairing sequence for enabling communications between the power switch 100 and the user device 320 can be initiated when a user causes the user device 320 to physically contact the power switch 100. More specifically, the user can initiate the pairing sequence by knocking the user device 320 against the power switch 100 a predetermined number of times, such as three times. In this manner, instances in which the user device 320 and the power switch 100 are inadvertently paired with one another can be reduced or eliminated. In some embodiments, the user may need to press the first button 122 of the power switch 100 immediately prior to knocking the user device 320 against the power switch 100.

In example embodiments, both the power switch 100 and the user device 320 can include an accelerometer configured to detect a user knocking the user device 320 against the power switch 100 to initiate the pairing sequence. More specifically, the one or more processors of the power switch 100 can be configured to process data received from the accelerometer of the power switch 100. Alternatively or additionally, one or more processors of the user device 320 can be configured to process data received from the accelerometer of the user device 320. In this manner, the physical contact (e.g., knocking) required to initiate the pairing sequence can be detected by the power switch 100, the user device 320, or both the power switch 100 and the user device 320.

In example embodiments, the one or more microphones of the power switch 100 can detect audible noise associated with knocking the user device 320 against the power switch 100. More specifically, the one or more microphones can provide one or more data signals indicative of the audible noise associated with knocking the user device 320 against the power switch 100. The one or more processors of the power switch 100 can be configured to process the data signal(s) to detect the user knocking the user device 320 against the power switch 100. It should be appreciated that the one or more processors of the power switch 100 can process the data signal(s) to recognize the audible noise associated with the user knocking the user device 320 against the power switch 100.

Figure 20:
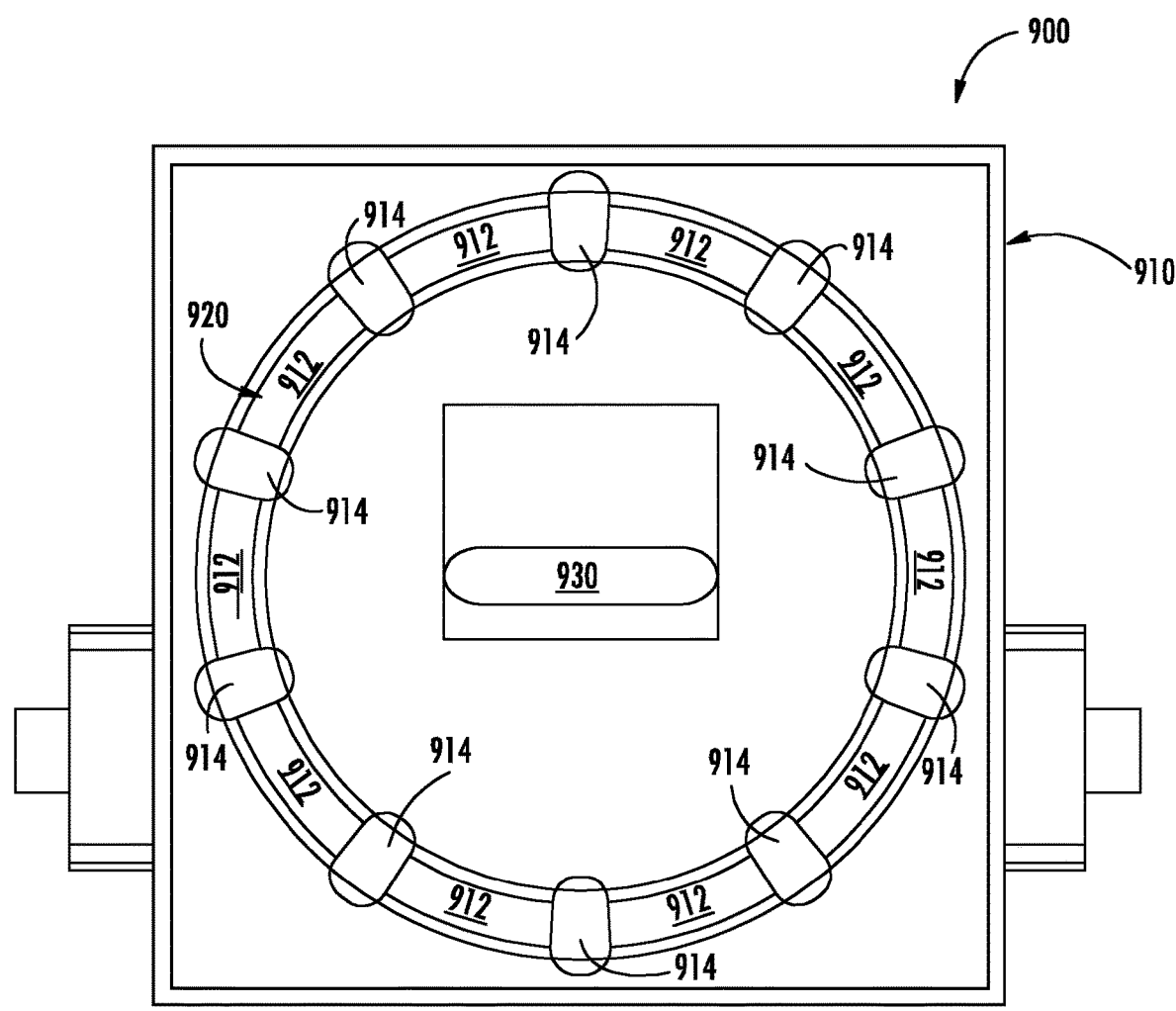
FIG. 20 depicts a rear view of an example light blocker according to example embodiments of the present disclosure.
Figure 21:
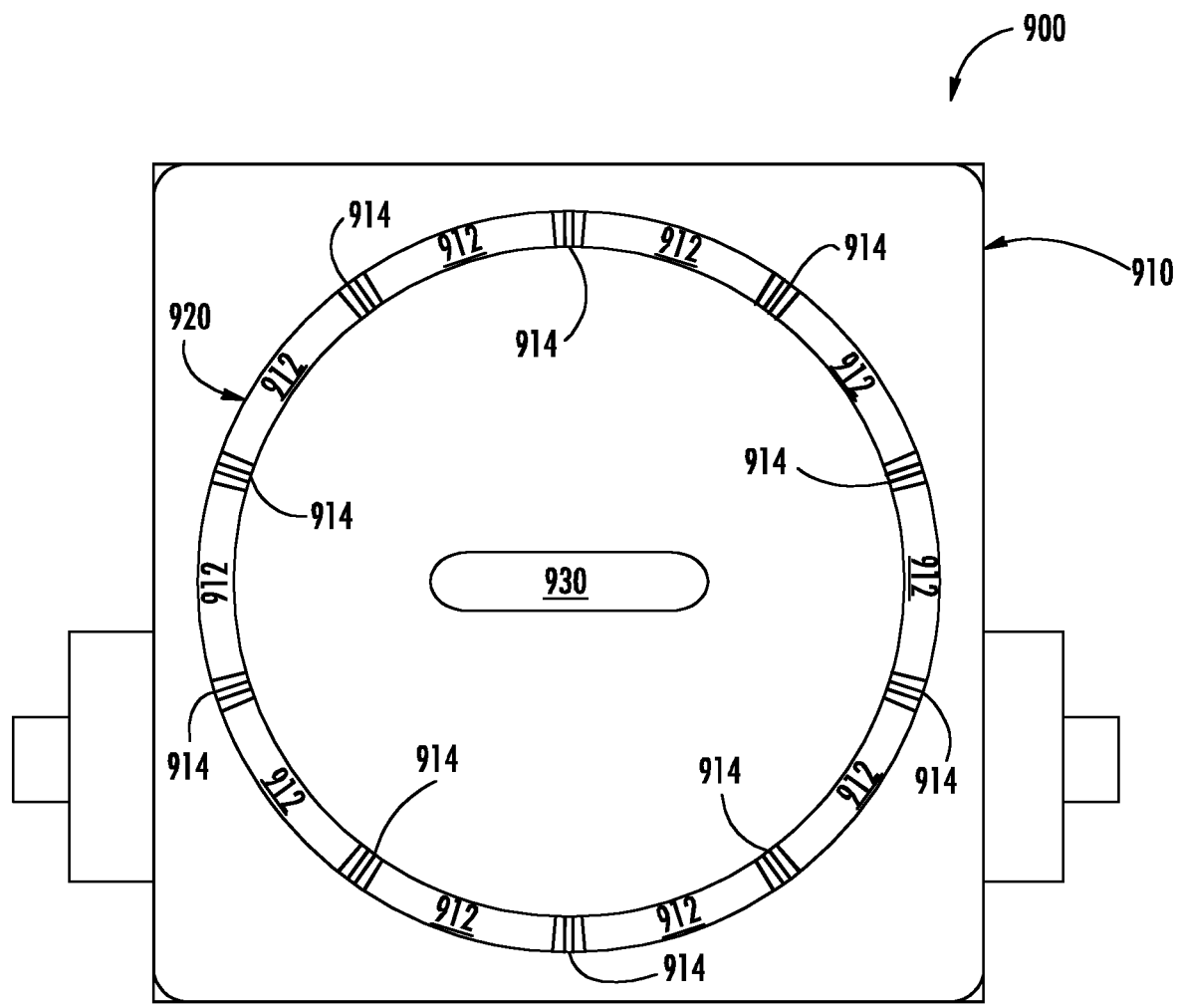
FIG. 21 depicts a front view of an example light blocker according to example embodiments of the present disclosure.

Referring now to FIGS. 20 and 21, an example embodiment of a light blocker 900 is provided according to example embodiments of the present disclosure. In some embodiments, the light blocker 900 can be positioned over the LED ring 172 (FIG. 5). When the light blocker 900 is positioned over the LED ring 172, the light blocker 900 can, as will be discussed below in more detail, improve the visual appearance of the light indicator ring 210 (FIG. 7) provided by the LED ring 172.

As shown, the light blocker 900 includes body 910. The body 910 can include a first plurality of segments 912 and a second plurality of segments 914. In some embodiments, a light transmissivity of the first plurality of segments 912 can be different than a light transmissivity of the second plurality of segments 914. For example, the light transmissivity of the first plurality of segments 912 can be greater than the light transmissivity of the second plurality of segments 914. In this manner, more light can pass through the first plurality of segments 912 compared to the second plurality of segments 914.

In some embodiments, the first plurality of segments 912 and the second plurality of segments 914 are arranged in an alternating manner such that each segment of the first plurality of segments 912 is positioned between two adjacent segments of the second plurality of segments 914. As an example, the first plurality of segments 912 and the second plurality of segments 914 can be arranged in an alternating manner to form a ring 920. The light blocker 900 can be positioned over the LED board 170 (FIG. 5) such that the ring 920 of the body 910 is aligned with the LED ring 172 (FIG. 5). More specifically, the light blocker 900 can be positioned over the LED board 170 such that each segment of the second plurality of segments 914 is aligned with one LED of the LED ring 172. Since the light transmissivity of the second plurality of segments 914 is less than the light transmissivity of the first plurality of segments 912, the light blocker 900 can reduce or eliminate hotspots in the light indicator ring 210. In this manner, the light blocker 900 can improve the visual appearance of the light indicator ring 210.

In some embodiments, the body 910 of the light blocker 900 can include a section 930 positioned at a center of the ring 920. In this manner, the section 930 can be aligned with the LED(s) 174 (FIG. 5) positioned at the center of the LED board 170. In some embodiments, a light transmissivity of the section 930 can be different than the light transmissivity of the second plurality of segments 914. For example, the light transmissivity of the section 930 can be greater than the light transmissivity of the second plurality of segments 914. Accordingly, more light can pass through the section 930 compared to the second plurality of segments 914.

In some embodiments, the first plurality of segments 912 can be one or more apertures defined by the body 910 of the light blocker 900. Alternatively or additionally, the section 930 can be an aperture defined by the body 910 of the light blocker 900.

It should be appreciated that the in-wall devices of the present disclosure can be implemented in any suitable environment. For instance, the in-wall devices can be implemented in one or more rooms of a hotel. In this manner, a guest can control one or more features of a room via the in-wall devices. For example, the guest can control operation of a television via one or more voice commands received at the in-wall devices. As another example, the guest can control operation of one or more light fixtures in the room.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A power switch, comprising:
    a housing mountable on or at least partially within a surface, the housing having a front panel;
    an interface element disposed on the front panel;
    a power interrupter operable to control power delivery to one or more powered loads based at least in part on user interaction with the interface element; and
    one or more processors configured to:
        obtain data indicative of presence of a user in a space associated with the power switch;
        obtain data indicative of one or more non-contact gestures;
        determine a control action based at least in part on the data indicative of presence of the user and based at least in part on the data indicative of the one or more non-contact gestures; and
        implement the control action, wherein the control action includes changing an operating mode of the power switch from a passive listening mode to an active listening mode, the active listening mode including activating one or more microphones.

2. The power switch of claim 1, wherein when the power switch is in the active listening mode, the one or more microphones of the power switch are activated to obtain data indicative of one or more voice commands spoken by a user.

3. The power switch of claim 1, wherein the control action is associated with controlling operation of the power interrupter to control power delivery to the one or more powered loads.

4. The power switch of claim 3, wherein controlling power delivery to the one or more powered loads comprises toggling power to the one or more powered loads.

5. The power switch of claim 1, wherein the power interrupter comprises a thyristor.

6. The power switch of claim 1, wherein the data indicative of one or more non-contact gestures includes data indicative of one or more hand gestures.

7. The power switch of claim 6, wherein the data indicative of one or more hand gestures is obtained via a passive infrared sensor of the power switch.

8. The power switch of claim 1, wherein the one or more processors are further configured to:
responsive to obtaining the data indicative of presence of the user in the space, control operation of a plurality of light emitting diode (LED) light sources of the power switch to provide an indicator.

9. The power switch of claim 8, wherein the indicator signifies the power switch is ready to receive a voice command.

10. The power switch of claim 1, further comprising:
the one or more microphones operable to obtain audio input;
one or more speakers configured to provide audio output; and
a communications interface operable to communicate data associated with the audio input over a communication link.

11. The power switch of claim 10, wherein the one or more processors are further configured to:
obtain data indicative of the audio input via the one or more microphones; and
provide the data indicative of the audio input to a digital audio assistant service.

12. A method for operating a power switch, the method comprising:
obtaining, by one or more processors of the power switch, data indicative of one or more non-contact gestures;
obtaining, by the one or more processors, data indicative of presence of a user in a space associated with the power switch;
determining, by the one or more processors, a control action based at least in part on the data indicative of presence of the user and based at least in part on the data indicative of the one or more non-contact gestures; and
implementing, by the one or more processors, the control action including changing an operating mode of the power switch from a passive listening mode to an active listening mode for receipt of one or more voice commands spoken by a user.

13. The method of claim 12, further comprising:
responsive to obtaining the data indicative of presence of the user, controlling, by the one or more processors, operation of a plurality of light emitting diode (LED) light sources of the power switch to provide an indicator to indicate the power switch is ready to receive a voice command.

14. The method of claim 12, further comprising:
detecting, by the one or more processors, an active listening mode trigger condition; and
responsive to detecting the active listening mode trigger condition, implementing, by the one or more processors, the active listening mode of the power switch.

15. The method of claim 14, wherein the active listening mode trigger condition is detected via one or more microphones of the power switch.

16. A power switch, comprising:
a housing mountable on or at least partially within a surface, the housing having a front panel;
an interface element disposed on the front panel;
a power interrupter operable to control power delivery to one or more powered loads based at least in part on user interaction with the interface element;
one or more microphones coupled to the housing, the one or more microphones operable to obtain audio input; and
one or more processors configured to:
obtain data indicative of presence of a user in a space associated with the power switch;
determine a control action based at least in part on the data indicative of presence of the user;
implement the control action including changing an operating mode of the power switch to an active listening mode; and
in the active listening mode, obtain data indicative of the audio input via the one or more microphones.

* * * * *